(12) United States Patent
Umezawa et al.

(10) Patent No.: US 10,685,816 B2
(45) Date of Patent: Jun. 16, 2020

(54) METHOD OF ETCHING OBJECT TO BE PROCESSED

(71) Applicant: TOKYO ELECTRON LIMITED, Tokyo (JP)

(72) Inventors: Yoshihiro Umezawa, Miyagi (JP); Jun Sato, Miyagi (JP); Kiyoshi Maeda, Miyagi (JP); Mitsunori Ohata, Miyagi (JP); Kazuya Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 31 days.

(21) Appl. No.: 15/775,218

(22) PCT Filed: Nov. 11, 2016

(86) PCT No.: PCT/JP2016/083455
§ 371 (c)(1),
(2) Date: May 10, 2018

(87) PCT Pub. No.: WO2017/082373
PCT Pub. Date: May 18, 2017

(65) Prior Publication Data
US 2018/0337025 A1    Nov. 22, 2018

(30) Foreign Application Priority Data

Nov. 13, 2015  (JP) .................................. 2015-222892
Jun. 20, 2016  (JP) .................................. 2016-121815

(51) Int. Cl.
*H01J 37/32* (2006.01)
*C23F 4/00* (2006.01)
(Continued)

(52) U.S. Cl.
CPC .......... *H01J 37/32715* (2013.01); *C23F 4/00* (2013.01); *H01F 10/3254* (2013.01);
(Continued)

(58) Field of Classification Search
CPC .................................................. H01J 37/32715
(Continued)

(56) References Cited

U.S. PATENT DOCUMENTS

2015/0090583 A1*  4/2015  Kodaira .............. H01J 7/32357
                                                         204/192.34
2016/0268162 A1*  9/2016  Akasaka ............... C23C 14/046

FOREIGN PATENT DOCUMENTS

| JP | 2012-204408 A | 10/2012 |
| TW | 201532220 A | 8/2015 |
| WO | 2015/097942 A1 | 7/2015 |

OTHER PUBLICATIONS

International Search Report dated Dec. 27, 2016 in PCT/JP2016/083455.

* cited by examiner

*Primary Examiner* — Roberts P Culbert
(74) *Attorney, Agent, or Firm* — Rothwell, Figg, Ernst & Manbeck, P.C.

(57) ABSTRACT

A method MT includes etching a wafer W using plasma generated in a processing container. The etching includes a process of inclining and rotating a holding structure holding the wafer W during execution of the etching and the process successively creating a plurality of inclined rotation states RT(φ, t) with respect to the holding structure. In the inclined rotation states, the wafer W is rotated about a central axis of the wafer W over a predetermined process time while maintaining a state where the central axis is inclined with respect to a reference axis of the processing container which is in the same plane as the central axis. A combination of a value φ of an inclination angle AN of the central axis with respect to the reference axis and the process time t differs for each of the plurality of inclined rotation states.

6 Claims, 22 Drawing Sheets

(51) Int. Cl.
    *H01L 43/12*     (2006.01)
    *H01F 41/34*     (2006.01)
    *H01F 10/32*     (2006.01)
    *G11C 11/16*     (2006.01)
    *H01L 43/02*     (2006.01)
    *H01L 43/10*     (2006.01)
    *H01F 41/30*     (2006.01)

(52) U.S. Cl.
    CPC ............. H01F 41/34 (2013.01); H01L 43/12 (2013.01); *G11C 11/161* (2013.01); *H01F 41/308* (2013.01); *H01J 37/3211* (2013.01); *H01J 2237/002* (2013.01); *H01J 2237/20207* (2013.01); *H01J 2237/20214* (2013.01); *H01J 2237/3343* (2013.01); *H01L 43/02* (2013.01); *H01L 43/10* (2013.01)

(58) Field of Classification Search
    USPC .......................................................... 438/716
    See application file for complete search history.

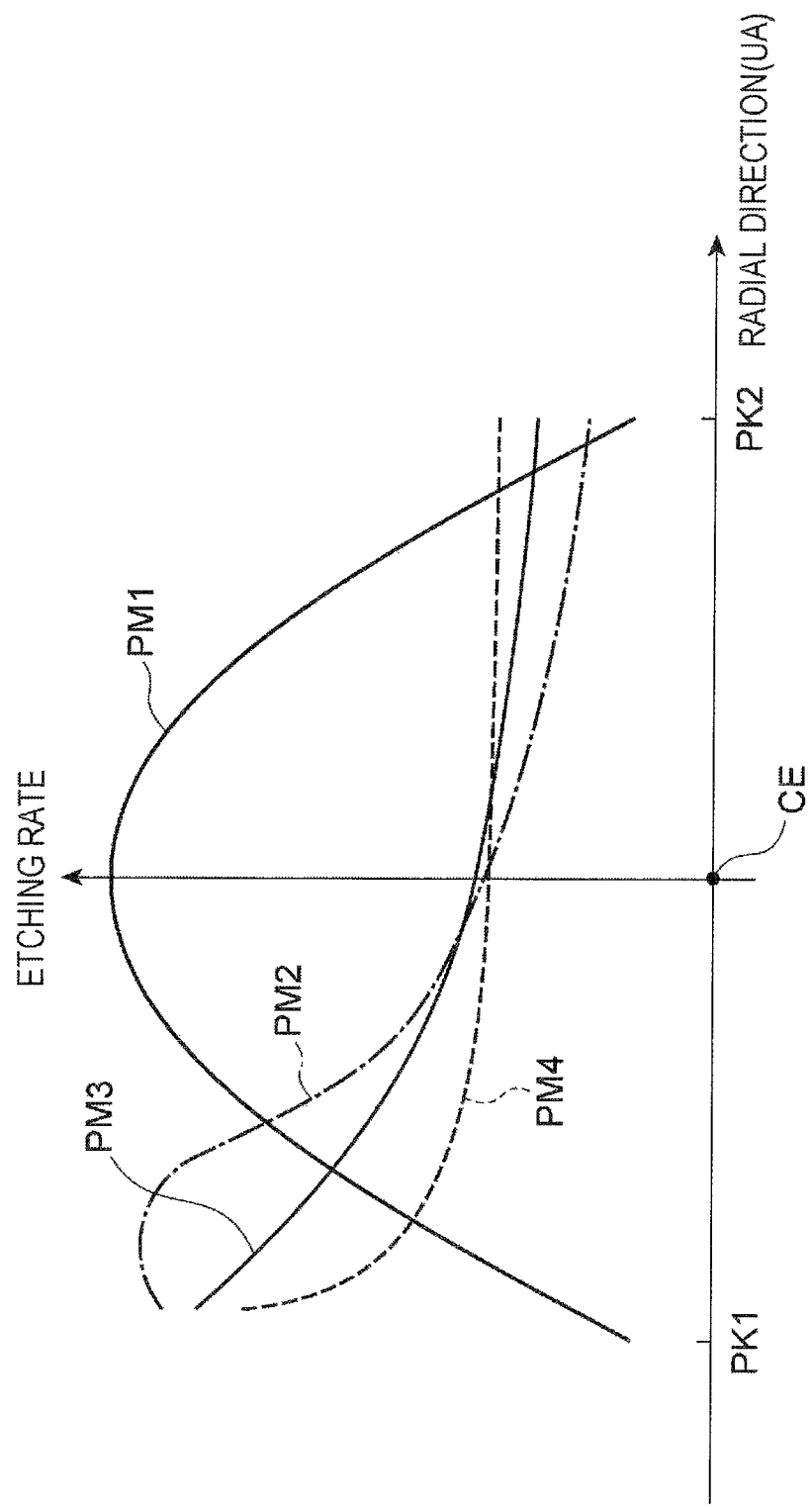

METHOD OF ETCHING OBJECT TO BE PROCESSED

CROSS REFERENCE TO RELATED APPLICATION

This application is a 35 U.S.C. 371 National Phase Entry Application from PCT/JP2016/083455, filed Nov. 11, 2016, which claims priority to Japanese Patent Application Nos. 2015-222892, filed Nov. 13, 2015 and 2016-121815, filed Jun. 20, 2016, the disclosures of which are incorporated herein in their entirety by reference, and priority is claimed to each of the foregoing.

TECHNICAL FIELD

Exemplary embodiments of the present disclosure relate to a method of etching an object to be processed ("workpiece").

BACKGROUND

As a type of memory element using a magnetoresistive effect element, a magnetic random access memory (MRAM) element having a magnetic tunnel junction (MTJ) structure has attracted attention. The MRAM element includes a multilayer film formed of a hard-to-etch material containing a metal such as, for example, a ferromagnetic material. In a step of manufacturing such an MRAM element, the multilayer film is etched using a mask formed of a metal material such as, for example, tantalum (Ta) or TiN.

In such etching, a halogen gas has been used in the art as described in Patent Document 1. The manufacturing method disclosed in Patent Document 1 is a method of manufacturing a semiconductor device, which includes a step of forming a magnetoresistive effect element using a magnetic material including at least one of cobalt, iron, and nickel. The step of forming the magnetoresistive effect element includes a step of forming a laminate including a plurality of layers containing a magnetic material on a semiconductor substrate, a step of processing the laminate by plasma etching using a gas containing chlorine in a vacuum atmosphere, and a step of performing a gas processing on the laminate using a gas containing an amino group while keeping the laminate in a vacuum atmosphere after processing the laminate.

PRIOR ART DOCUMENT

Patent Document

Patent Document 1: Japanese Patent Laid-Open Publication No. 2012-204408

DISCLOSURE OF THE INVENTION

Problems to be Solved

However, in the plasma etching as disclosed in, for example, Patent Document 1, deviation occurs in the distribution of the density of plasma in a processing container according to the configuration of a plasma processing apparatus (e.g., the shape of the processing container), and by this deviation, the etching rate on the surface of a wafer in the processing container becomes uneven. When the etching rate is uneven, the quality of the wafer after etching deteriorates, which is also undesirable from the viewpoint of manufacturing efficiency. Therefore, there is a need to improve the uniformity of the etching rate during the plasma etching.

Means to Solve the Problems

In one aspect, a method of etching a workpiece by using a plasma processing apparatus is provided. The plasma processing apparatus includes a holding structure configured to hold the workpiece and a processing container configured to accommodate the holding structure therein. The method includes a step of etching the workpiece by plasma generated in the processing container (hereinafter referred to as "step a") and performing a process of inclining and rotating the holding structure holding the workpiece during execution of the etching (hereinafter referred to as "process b"). The process b sequentially implements a plurality of inclined rotation states with respect to the holding structure holding the workpiece. In the inclined rotation states, the workpiece is rotated about a central axis thereof over a predetermined process time while maintaining a state in which the central axis is inclined with respect to a reference axis of the processing container in the same plane as the central axis. In the plurality of inclined rotation states, a combination of a value of an inclination angle of the central axis with respect to the reference axis and the process time differs from each other in the plurality of inclined rotation states. In this method, since a plurality of inclined rotation states having different inclination angles of the workpiece and process times can be implemented in combination during the execution of etching, it is possible to sufficiently improve the uniformity of the etching rate for the workpiece by adjusting the combination.

In one exemplary embodiment, in the processing container, in the state in which the central axis is not inclined with respect to the reference axis, an etching rate on a surface of the workpiece is implemented in an axis-symmetric distribution about the reference axis, and the distribution of the etching rate is highest at a position of the reference axis on the surface. Thus, since the etching rate is in axis-symmetric distribution about the reference axis in the state in which the central axis is not inclined, the distribution of the etching rate including the interval of contour lines of the distribution can be adjusted with good accuracy by suitably inclining the central axis such that the center of the distribution of the etching rate is moved on the surface of the workpiece so as to eliminate axis-symmetry. Then, by implementing the distribution of the etching rate from which the axis-symmetry is eliminated in this way, the height difference in the distribution of the etching rate may be sufficiently eliminated by the rotation of the workpiece about the central axis, and the uniformity of the etching rate is improved.

In one exemplary embodiment, a plurality of predicted distributions of the etching rate with on the surface of the workpiece are acquired in advance before execution of the step a, the predicted distributions differ depending on a combination of the value of the inclination angle and a condition of etching performed in the processing container, the etching rate, obtained by each of the plurality of inclined rotation states, corresponds to one of the plurality of predicted distributions, and the process time of each of the plurality of inclined rotation states is indicated by a weighting value given to the predicted distributions. Among the plurality of predicted distributions, a plurality of predicted distributions having the same condition as the condition of the etching performed in the step a, and a weighting value of each of the plurality of predicted distributions are specified ("specify" mean "to find", which is equally applicable to the following) before the step, the plurality of inclined rotation states are specified by using the value of the inclination angle of each of the plurality of specified predicted distributions and the weighting value, and the plurality of specified inclined rotation states are implemented in the step a. Thus, since a plurality of inclined rotation states implemented in the step a are specified using the predicted distributions of the etching rate acquired in advance, it is possible to effectively implement the uniformity of the distribution of the etching rate that is actually implemented.

In one exemplary embodiment, each predicted distribution corresponds to a numerical value obtained by integrating $\zeta/\{(x-\alpha)^2+(y-\beta)^2+(z-\gamma)^2\}^{\xi/2}$, which is a function of coordinates (x, y, z) of a point in the processing container and includes parameters $\alpha$, $\beta$, $\gamma$, $\zeta$, and $\xi$, about the central axis, where x, y, and z indicate the point in the processing container with respective coordinates of an X-axis, an Y-axis, and a Z-axis of an XYZ orthogonal coordinate system set to the processing container, $\alpha$, $\beta$, and $\gamma$ indicate a predetermined reference point on a side of a plasma source of the plasma processing apparatus with respective coordinates of the X-axis, the Y-axis, and the Z-axis, $\zeta$ is an etching rate at the point (x, y, z) in the processing container when a length from the reference point to the point (x, y, z) is a unit length, and the parameters $\alpha$, $\beta$, $\gamma$, $\zeta$, and $\xi$ are specified by actually measured values of the etching rate by etching performed under the same condition as the condition of the etching in the process. Since the predicted distribution of the etching rate is precisely indicated using the coordinate values for each point in the processing container, the inclination angle and the process time for each inclined rotation state may be specified with good accuracy using the predicted distribution.

In one exemplary embodiment, respective values of the parameters $\alpha$, $\beta$, $\gamma$, $\zeta$, and $\xi$ are determined for each value depending on the value of the inclination angle. Since the values of the parameters $\alpha$, $\beta$, $\gamma$, $\zeta$, and $\xi$ are determined for each value depending on the value of the inclination angle, the inclination angle for implementing the etching rate corresponding to the predicted distribution is easily specified by specifying the predicted distribution.

In one exemplary embodiment, in the processing container, a position of an intersection point of the central axis and the reference axis is movable along the reference axis, the predicted distributions differ depending on a combination of the value of the inclination angle, and the condition of the etching performed in the processing container, and the position of the intersection point, and the respective values of the parameters $\alpha$, $\beta$, $\gamma$, $\zeta$, and $\xi$ are determined for each value depending on the value of the inclination angle and the position of the intersection point. In this method, in addition to the value of the inclination angle, since the predicted distribution depending on the position of the intersection point of the central axis and the reference axis may further be used, it is possible to specify a suitable inclination angle and process time used in the step a in more detail.

In one exemplary embodiment, in the processing container, a position of an intersection point of the central axis and an upper surface of an electrostatic chuck, which is included in the holding structure and holds the workpiece is movable along the central axis while maintaining an orientation of the upper surface, the predicted distributions differ depending on a combination of the value of the inclination angle, the condition of the etching performed in the processing container, and the position of the intersection point, and the respective values of the parameters $\alpha$, $\beta$, $\gamma$, $\zeta$, and $\xi$ are determined for each value depending on the value of the inclination angle and the position of the intersection point. In this method, Further, in addition to the value of the inclination angle, since the predicted distribution corresponding to the position of the intersection point of the upper surface of the electrostatic chuck and the central axis may further be used, it is possible to specify a suitable inclination angle and process time used in the step a in more detail.

Effect of the Invention

As described above, during plasma etching, the uniformity of the etching rate is improved.

BRIEF DESCRIPTION OF THE DRAWINGS

FIG. 20 is a view illustrating the distribution of the etching rate illustrated in FIG. 19 in the radial direction of the surface of the wafer.

FIGS. 21A, 21B, 12C, and 21D are views illustrating an example of the content of an etching rate function according to a modification of the exemplary embodiment.

DETAILED DESCRIPTION TO EXECUTE THE INVENTION

Figure 1:
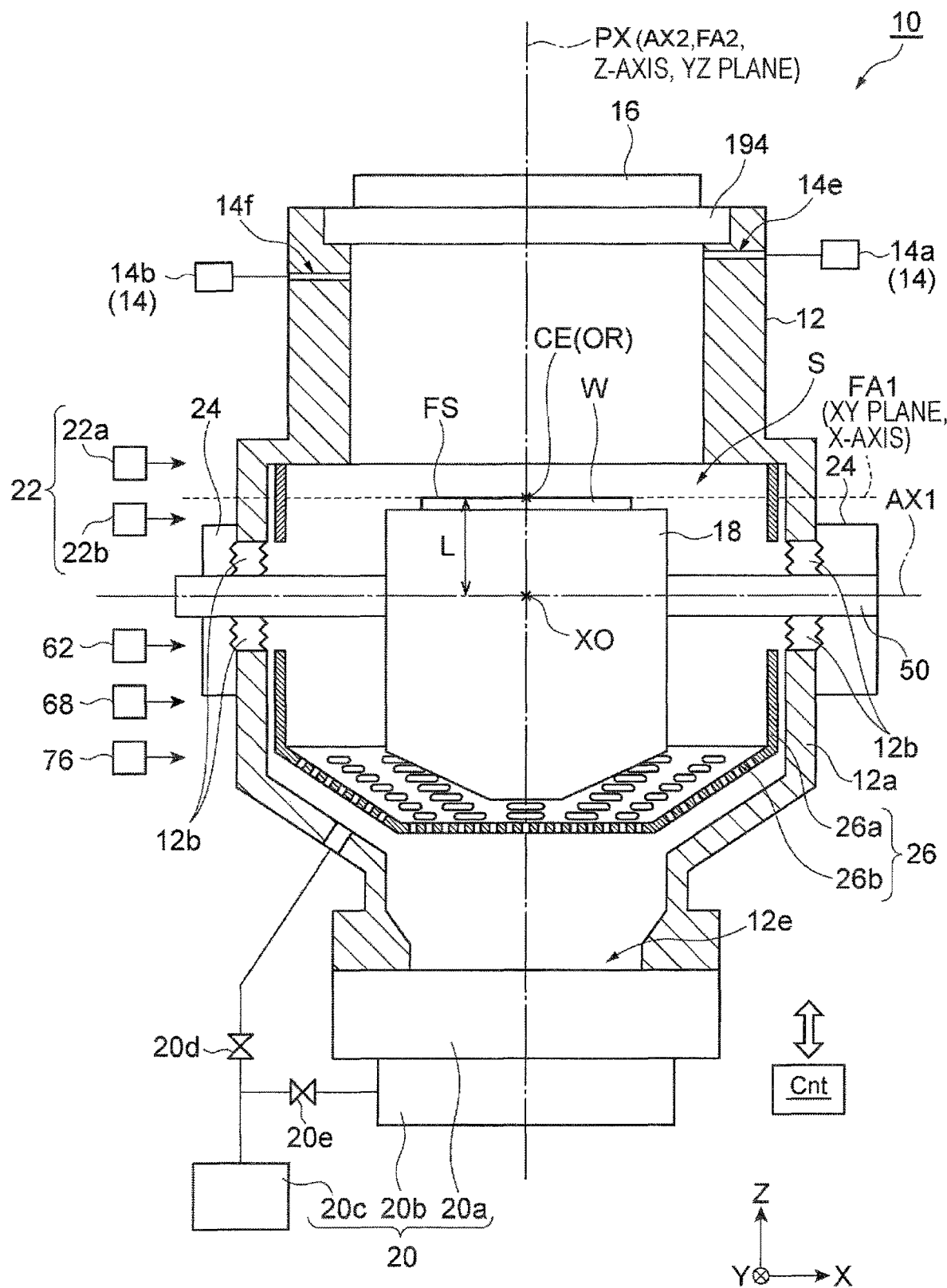
FIG. 1 is a view schematically illustrating a plasma processing apparatus according to one exemplary embodiment.

Hereinafter, various exemplary embodiments will be described in detail with reference to the drawings. In the respective drawings, the same reference numerals will be given to the same or corresponding parts.

Figure 2:
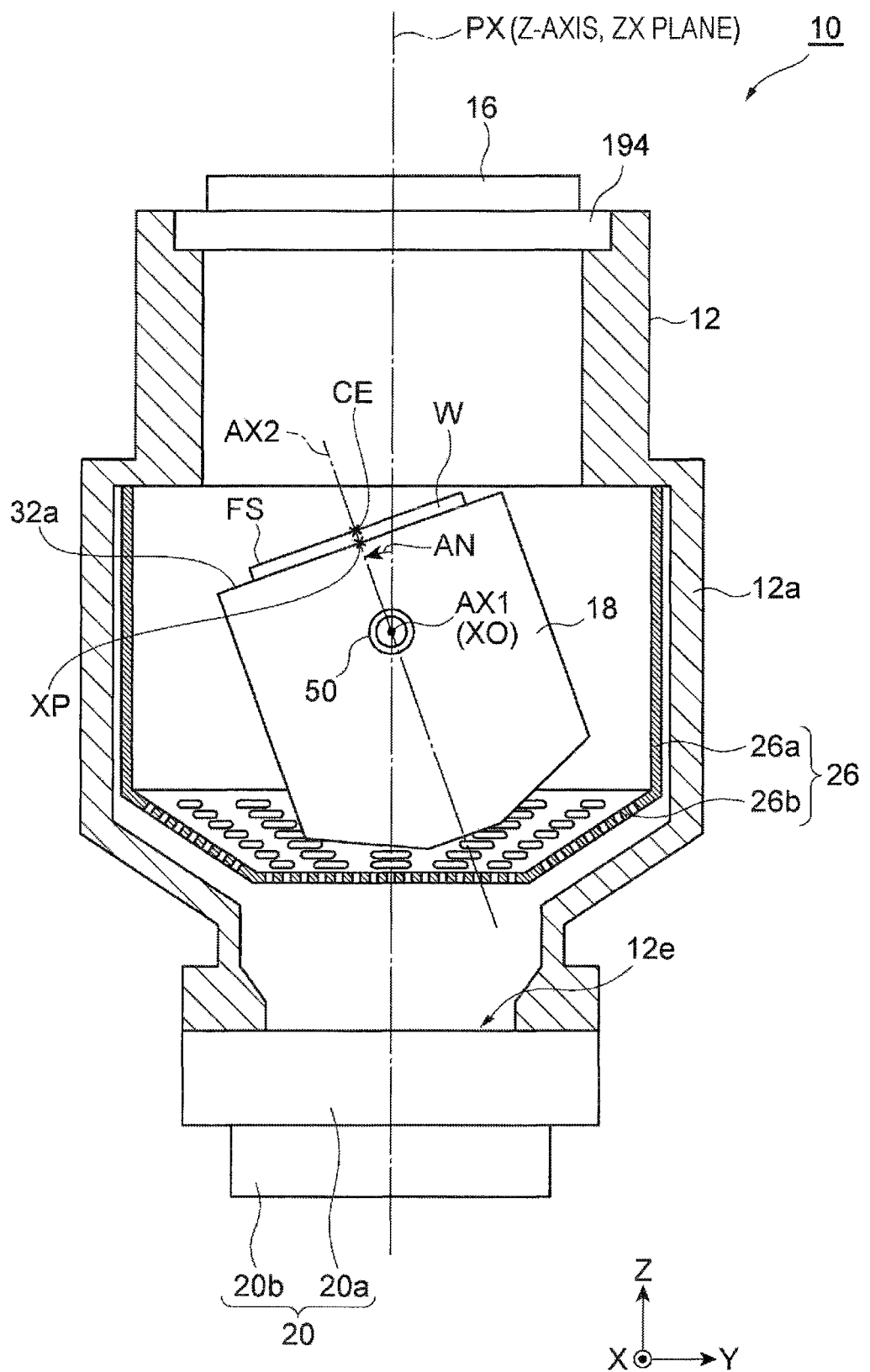
FIG. 2 is a view schematically illustrating the plasma processing apparatus according to the exemplary embodiment.

FIGS. 1 and 2 are views schematically illustrating a plasma processing apparatus according to one exemplary embodiment, in which the plasma processing apparatus is illustrated by cutting a processing container 12 in a plane including an axis PX extending in the vertical direction (a reference axis of the processing container 12). In addition, FIG. 1 illustrates the plasma processing apparatus in a state where a holding structure to be described later is not inclined, and FIG. 2 illustrates the plasma processing apparatus in a state where the holding structure is inclined.

The plasma processing apparatus 10 illustrated in FIGS. 1 and 2 includes the processing container 12, a gas supply system 14, a plasma source 16, a holding structure 18, an exhaust system 20, a bias power supply unit 22, and a control unit Cnt. The processing container 12 has a substantially cylindrical shape. The central axis of the processing container 12 coincides with the axis PX. The processing container 12 provides a space S for performing a plasma processing on a workpiece (hereinafter sometimes referred to as "wafer W").

The axis PX extends in a direction from the ceiling side of the processing container 12, on which, for example, the plasma source 16 or a dielectric plate 194 is provided, toward the bottom portion side of the processing container 12, on which, for example, the holding structure 18 or an automatic pressure controller 20a is provided. In addition, FIGS. 1 and 2 illustrate an XYZ orthogonal coordinate system for specifying a position in the processing container 12 (hereinafter the term "specify" means "find"). The XYZ orthogonal coordinate system has the X-axis, the Y-axis, and the Z-axis, which are orthogonal to each other, and an origin OR, at which these three axes intersect each other. It may be said that FIG. 1 is a view of the inside of the plasma processing apparatus 10 as viewed in the Y direction, and FIG. 2 is a view of the inside of the plasma processing apparatus 10 as viewed in the direction opposite to the X direction. The axis PX coincides with the Z-axis, is in the YZ plane, and is orthogonal to the XY plane.

In one exemplary embodiment, the processing container 12 has an approximately constant width in an intermediate portion 12a in the height direction thereof, that is to say, the portion in which the holding structure 18 is accommodated. In addition, the processing container 12 has a tapered shape in which the width gradually decreases from the lower end of the intermediate portion to the bottom portion. In addition, the bottom portion of the processing container 12 provides an exhaust port 12e, and the exhaust port 12e is axis-symmetrical with respect to the axis PX.

The gas supply system 14 is configured to supply a gas into the processing container 12. The gas supply system 14 includes a first gas supply unit 14a and a second gas supply unit 14b. The first gas supply unit 14a is configured to supply a first processing gas into the processing container 12. The second gas supply unit 14b is configured to supply a second processing gas into the process container 12. In addition, details of the gas supply system 14 will be described later.

The plasma source 16 is configured to excite the gas supplied into the processing container 12. In one exemplary embodiment, the plasma source 16 is provided on the ceiling portion of the processing container 12. The central axis of the plasma source 16 coincides with the axis PX. In addition, details of an example of the plasma source 16 will be described later.

The holding structure 18 is configured to hold the wafer W in the processing container 12. The holding structure 18 is configured to be rotatable about a first axis AX1 orthogonal to the axis PX. The first axis AX1 coincides with the central axis of a inclination shaft unit 50. In addition, the holding structure 18 is configured to rotate the wafer W about a second axis AX2 orthogonal to the first axis AX1. The holding structure 18 may be inclined with respect to the axis PX by rotation thereof about the first axis AX1. In order to incline the holding structure 18, the plasma processing apparatus 10 includes a driving device 24. The driving device 24 is provided at the outside of the processing container 12, and generates a driving force for rotating the holding structure 18 about the first axis AX1.

The first axis AX1 extends in parallel with a horizontal reference plane FA1, the XY plane, and the X axis. The first axis AX1 is orthogonal to the Y axis and the Z axis, and is orthogonal to a vertical reference plane FA2. The horizontal reference plane FA1 is orthogonal to the axis PX, includes the origin OR, is orthogonal to the Z axis, and overlaps the XY plane. The horizontal reference plane FA1 includes a surface FS of the wafer W placed on a holding unit 30 of the holding structure 18. The vertical reference plane FA2 coincides with the YZ plane, is orthogonal to the horizontal reference plane FA1, the XY plane, the X axis, and the first axis AX1, and includes the axis PX, the second axis AX2, and the origin OR. The first axis AX1 is orthogonal to the axis PX, the second axis AX2, and the vertical reference plane FA2, and coincides with the central axis of the inclination shaft unit 50. The surface FS of the wafer W is orthogonal to the vertical reference plane FA2 and the second axis AX2, and extends in parallel with the X axis and the first axis AX1. The second axis AX2 is orthogonal to the surface FS of the wafer W. The second axis AX2 coincides with the central axis of the wafer W. The second axis AX2 passes through the center CE of the surface FS of the wafer W. The axis PX and the first axis AX1 intersect each other at an intersection point XO. When the second axis AX2 is inclined with respect to the axis PX, the axis PX, the first axis AX1, and the second axis AX2 intersect each other at the intersection point XO. The intersection point XO is on the first axis AX1, and is on the vertical reference plane FA2, the YZ plane, and the ZX plane. The distance from the intersection point XO to the horizontal reference plane FA1 is the distance L.

In a state where the holding structure 18 is not inclined, as illustrated in FIG. 1, the second axis AX2 coincides with the axis PX. In this state, the surface FS of the wafer W is orthogonal to the axis PX, overlaps the horizontal reference plane FA1 and the XY surface, and includes the origin OR. The center CE of the surface FS coincides with the origin OR, and is located on each of the axis PX and the second axis AX2. The second axis AX2 (the central axis of the wafer W) overlaps the axis PX, and includes the origin OR. In addition, in the exemplary embodiment, for convenience of explanation, the origin OR is assumed to coincide with the center CE of the surface FS of the wafer W as described above, but the present disclosure is not limited thereto.

On the other hand, in a state where the holding structure 18 is inclined, the second axis AX2 is inclined with respect to the axis PX. The inclination angle AN of the second axis AX2 is an angle formed by the second axis AX2 and the axis PX. The inclination angle AN is an angle in the YZ plane. The second axis AX2 and the axis PX are on the YZ plane. As illustrated in FIG. 2, the value φ of the inclination angle AN of the second axis AX2 is set to take a positive value when the holding structure 18 is rotated and inclined about the first axis AX1 so that the surface FS of the wafer W faces the −Y direction. When the second axis AX2 coincides with the axis PX (when the holding structure 18 is not inclined), the value φ of the inclination angle AN of the second axis AX2 is zero. Details of the holding structure 18 will be described later.

The exhaust system 20 is configured to reduce the pressure in the processing container 12. In one exemplary embodiment, the exhaust system 20 includes an automatic pressure controller 20a, a turbo molecular pump 20b, and a dry pump 20c. The turbo molecular pump 20b is provided downstream of the automatic pressure controller 20a. The dry pump 20c is directly connected to the space inside the processing container 12 via a valve 20d. In addition, the dry pump 20c is provided downstream of the turbo molecular pump 20b via a valve 20e.

The exhaust system, which includes the automatic pressure controller 20a and the turbo molecular pump 20b, is attached to the bottom portion of the processing container 12. In addition, the exhaust system, which includes the automatic pressure controller 20a and the turbo molecular pump 20b, is provided directly under the holding structure 18. Therefore, in the plasma processing apparatus 10, it is possible to form a uniform exhaust flow from the periphery of the holding structure 18 to the exhaust system 20. Thereby, efficient exhaust may be achieved. In addition, it is possible to uniformly diffuse plasma generated in the processing container 12.

In one exemplary embodiment, a flow regulating member 26 may be provided in the processing container 12. The flow regulating member 26 has a substantially tubular shape having a closed lower end. The flow regulating member 26 extends along the inner wall surface of the processing container 12 so as to surround the holding structure 18 from the lateral side and the lower side. In one example, the flow regulating member 26 includes an upper portion 26a and a lower portion 26b. The upper portion 26a has a cylindrical shape with a constant width, and extends along the inner wall surface of the intermediate portion 12a of the processing container 12. In addition, the lower portion 26b is provided below the upper portion 26a and is continuous with the upper portion 26a. The lower portion 26b has a tapered shape in which the width thereof gradually decreases along the inner wall surface of the processing container 12, and has a flat plate shape at the lower end thereof. A large number of openings (through-holes) are formed in the lower portion 26b. With the flow regulating member 26, a pressure difference may be formed between the inside of the flow regulating member 26, that is, the space in which the wafer W is accommodated, and the outside of the flow regulating member 26, that is, the space on the exhaust side, and it is possible to adjust the residence time of the gas in the space where the wafer W is accommodated. In addition, uniform exhaust may be implemented.

Figure 3:
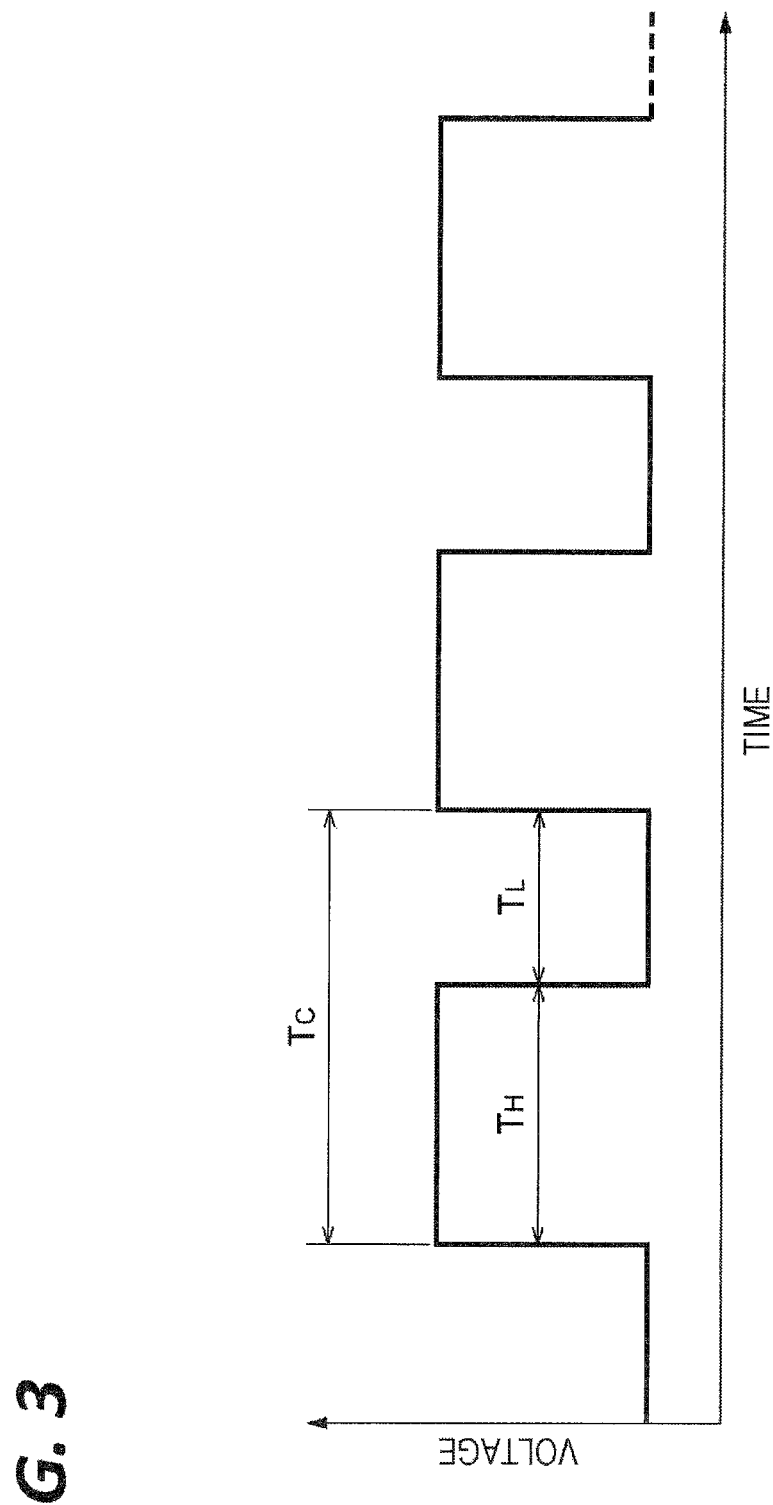
FIG. 3 is a view illustrating a pulse-modulated bias voltage.

The bias power supply unit 22 is configured to selectively apply a bias voltage and a high-frequency bias power to the holding structure 18 for introducing ions to the wafer W. In one exemplary embodiment, the bias power supply unit 22 includes a first power supply 22a and a second power supply 22b. The first power supply 22a generates a pulse-modulated DC voltage (hereinafter referred to as "modulated DC voltage") as a bias voltage to be applied to the holding structure 18. FIG. 3 is a view illustrating a pulse-modulated DC voltage. As illustrated in FIG. 3, the modulated DC voltage is a voltage in which a period $T_H$ during which the voltage value takes a high level and a period $T_L$ during which the voltage value takes a low level are alternately repeated. The modulated DC voltage may be set to a voltage value within the range of 0V to 1200V, for example. The high-level voltage value of the modulated DC voltage is a voltage value set within the range of the voltage value described above, and the low-level voltage value of the modulated DC voltage is a voltage value lower than the high-level voltage value. As illustrated in FIG. 3, the sum of the period $T_H$ and the period $T_L$ continuous with the period $T_H$ constitutes one cycle $T_C$. In addition, the frequency of pulse modulation of the modulated DC voltage is $1/T_C$. The frequency of pulse modulation may be arbitrarily set, but may be a frequency at which a sheath capable of accelerating ions may be formed, and may be, for example, 400 [kHz]. In addition, the on-duty ratio, that is, the ratio occupied by the period $T_H$ in one cycle $T_C$ is a ratio within the range of 10% to 90%.

The second power supply 22b is configured to supply a high-frequency bias power to the holding structure 18 for introducing ions into the wafer W. The frequency of the high-frequency bias power is an arbitrary frequency suitable for introducing ions into the wafer W, and is, for example, 400 [kHz]. The plasma processing apparatus 10 may selectively supply the modulated DC voltage from the first power supply 22a and the high-frequency bias power from the second power supply 22b to the holding structure 18. The selective supply of the modulated DC voltage and the high-frequency bias power may be controlled by the control unit Cnt.

The control unit Cnt is, for example, a computer including a processor, a storage unit, an input device, and a display device. The control unit Cnt operates according to a program based on an input recipe, and sends out a control signal. Each unit of the plasma processing apparatus 10 is controlled by the control signal from the control unit Cnt.

Hereinafter, each of the gas supply system 14, the plasma source 16, and the holding structure 18 will be described in detail.

[Gas Supply System]

The gas supply system 14 includes the first gas supply unit 14a and the second gas supply unit 14b as described above. The first gas supply unit 14a supplies the first processing gas into the processing container 12 through one or more gas discharge holes 14e. In addition, the second gas supply unit 14b supplies the second processing gas into the processing container 12 through one or more gas discharge holes 14f. The gas discharge holes 14e are formed at a position closer to the plasma source 16 than the gas discharge holes 14f. Therefore, the first processing gas is supplied to a position closer to the plasma source 16 than the second processing gas. In addition, in FIGS. 1 and 2, the number of gas discharge holes 14e and the number of gas discharge holes 14f are "1", respectively, but a plurality of gas discharge holes 14e and a plurality of gas discharge holes 14f may be formed. The plurality of gas discharge holes 14e may be uniformly arranged in the circumferential direction with respect to the axis PX. In addition, the plurality of gas discharge holes 14f may also be uniformly arranged in the circumferential direction with respect to the axis PX.

In one exemplary embodiment, a partition plate, so-called ion trap, may be provided between the region in which the gas is discharged by the gas discharge holes 14e and the region in which the gas is discharged by the gas discharge holes 14f. Thereby, it is possible to adjust the amount of ions flowing from the plasma of the first processing gas to the wafer W.

The first gas supply unit 14a may include one or more gas sources, one or more flow-rate controllers, and one or more valves. Therefore, the flow rate of the first processing gas from the one or more gas sources of the first gas supply unit 14a is adjustable. In addition, the second gas supply unit 14b may include one or more gas sources, one or more flow-rate controllers, and one or more valves. Therefore, the flow rate of the second processing gas from the one or more gas sources of the second gas supply unit 14b is adjustable. The flow rate of the first processing gas and the supply timing of the first processing gas from the first gas supply unit 14a and the flow rate of the second processing gas and the supply timing of the second processing gas from the second gas supply unit 14b are individually adjusted by the control unit Cnt.

Figure 4:
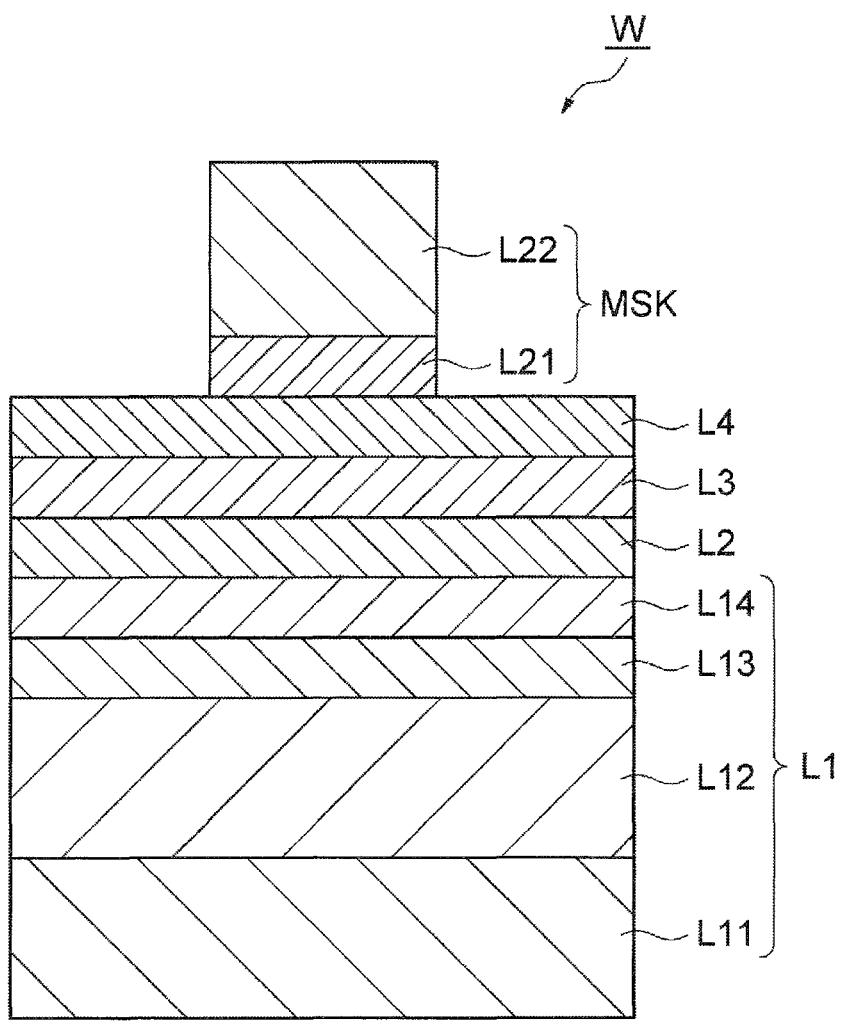
FIG. 4 is a cross-sectional view illustrating an example of a workpiece.

Hereinafter, three examples of the first processing gas and the second processing gas will be described below. In order to explain the utilization modes of the first processing gas and the second processing gas according to these three examples, first, an example of the workpiece will be described with reference to FIG. 4. FIG. 4 is a cross-sectional view illustrating an example of the workpiece. The wafer W illustrated in FIG. 4 is the workpiece, from which an MRAM element having an MTJ structure may be made from the wafer W, and includes a multilayer film constituting the MRAM element. Specifically, the wafer W includes an underlying layer L1, a lower magnetic layer L2, an insulating layer L3, an upper magnetic layer L4, and a mask MSK.

The underlying layer L1 includes a lower electrode layer L11, an anti-ferromagnetic layer L12, a ferromagnetic layer L13, and a nonmagnetic layer L14. The lower electrode layer L11 may be formed of, for example, Ta. The anti-ferromagnetic layer L12 is formed on the lower electrode layer L11, and may be formed of, for example, PtMn. That is, the underlying layer L1 may include a PtMn layer. The ferromagnetic layer L13 is formed on the anti-ferromagnetic layer L12, and may be formed of, for example, CoFe. In addition, the nonmagnetic layer L14 is e formed on the ferromagnetic layer L13, and may be formed of Ru, for example.

The lower magnetic layer L2, the insulating layer L3, and the upper magnetic layer L4 are a multilayer film forming an MTJ structure. The lower magnetic layer L2 is formed on the nonmagnetic layer L14, and may be formed of, for example, CoFeB. In addition, the ferromagnetic layer L13, the nonmagnetic layer L14, and the lower magnetic layer L2 constitute a fixed magnetization layer. The insulating layer L3 may be formed between the lower magnetic layer L2 and the upper magnetic layer L4, and may be formed of, for example, magnesium oxide (MgO). In addition, the upper magnetic layer L4 is formed on the insulating layer L3, and may be formed of, for example, CoFeB.

The mask MSK is formed on the upper magnetic layer L4. The mask MSK may include a first layer L21 and a second layer L22. The first layer L21 is formed on the upper magnetic layer L4, and may be formed of, for example, Ta. The second layer L22 is formed on the first layer L21, and may be formed of, for example, TiN. In the region of the wafer W that is not covered with the mask MSK, the multilayer film from the upper magnetic layer L4 to the anti-ferromagnetic layer L12 is etched. Three examples of the first processing gas and the second processing gas will be described below by taking the wafer W as an example.

In a first example, the first processing gas may be a rare gas. The rare gas is a He gas, Ne gas, Ar gas, Kr gas, or Xe gas. In addition, the first processing gas may be a gas selected from among a He gas, Ne gas, Ar gas, Kr gas, and Xe gas. For example, when etching the multilayer film of the wafer W illustrated in FIG. 4 by using the plasma processing apparatus 10, a rare gas suitable for etching each layer is selected.

In addition, in the first example, the second processing gas may be a hydrogen-containing gas. As the hydrogen-containing gas, a $CH_4$ gas or $NH_3$ gas is exemplified. The active species of hydrogen derived from such a second processing gas reforms a substance contained in the multilayer film, that is, a metal, into a state where it is easily etched by a reduction action. In addition, carbon contained in the $CH_4$ gas or nitrogen contained in the $NH_3$ gas combines with the material constituting the mask MSK to form a metal compound. Thereby, the mask MSK is strengthened, and the etching rate [μm/min] of the mask MSK is reduced with respect to the etching rate [μm/min] ("min" means "minute"). As a result, it is possible to improve the selectivity of etching of the layers constituting the multilayer film, other than the mask MSK in the wafer W.

In such a first example, the first processing gas and the second processing gas may be excited by the plasma source 16. In the first example, the supply amounts of the first processing gas and the second processing gas at the time of plasma generation are individually controlled by the control of the control unit Cnt.

In a second example, the first processing gas may be a decomposable gas that is dissociated by the plasma generated by the plasma source 16 to generate a radical. The radical derived from the first processing gas may be a radical that causes a reduction reaction, an oxidation reaction, a chlorination reaction, or a fluorination reaction. The first processing gas may be a gas containing a hydrogen element, an oxygen element, a chlorine element, or a fluorine element. Specifically, the first processing gas may be Ar, $N_2$, $O_2$, $H_2$, He, $BCl_3$, $Cl_2$, $CF_4$, $NF_3$, $CH_4$, or $SF_6$, for example. As the first processing gas for generating the radical of the reduction reaction, for example, $H_2$ is exemplified. As the first processing gas for generating the radical of the oxidation reaction, for example, $O_2$ is exemplified. As the first processing gas for generating the radical of the chlorination reaction, for example, $BCl_3$ or $Cl_2$ is exemplified. As the first processing gas for generating the radical of the fluorination reaction, for example, $CF_4$, $NF_3$, or $SF_6$ is exemplified.

In addition, in the second example, the second processing gas may be a gas that reacts with a substance to be etched without being exposed to plasma. As the second processing gas, for example, a reaction with a substance to be etched may contain a gas that depends on the temperature of the holding structure 18. Specifically, for example, HF, $Cl_2$, HCl, $H_2O$, $PF_3$, $F_2$, $ClF_3$, $COF_2$, cyclopentadiene, or Amidinato is used as the second processing gas. In addition, the second processing gas may include an electron donating gas.

The electron donating gas generally refers to a gas formed of atoms having greatly different electro-negativity or ionization potential, or a gas containing atoms having a lone pair of electrons. The electron donating gas has a property of easily giving electrons to other compounds. For example, the electron donating gas has a property of binding, as a ligand, with, for example, a metal compound and evaporating. As the electron donating gas, for example, $SF_6$, $PH_3$, $PF_3$, $PCl_3$, $PBr_3$, $PI_3$, $CF_4$, $AsH_3$, $SbH_3$, $SO_3$, $SO_2$, $H_2S$, $SeH_2$, $TeH_2$, $Cl_3F$, $H_2O$, or $H_2O_2$, or a gas containing a carbonyl group is exemplified.

The first processing gas and the second processing gas of the second example may be used for removing a deposit generated by etching of the multilayer film of the wafer W illustrated in FIG. 4. Specifically, the deposit is reformed by the radical derived from the first processing gas, and then, a reaction between the reformed deposit and the second processing gas occurs. This makes it possible to easily exhaust the deposit. In such a second example, the first processing gas and the second processing gas may be alternately supplied. When the first processing gas is supplied, plasma is generated by the plasma source 16, and when the second processing gas is supplied, generation of the plasma by the plasma source 16 is stopped. The supply of the first processing gas and the second processing gas as described above is controlled by the control unit Cnt. That is, in the second example, the supply amount of the first processing gas and the supply amount of the second processing gas depending on the state of plasma at the time of plasma generation and at the time of plasma extinction may be controlled by the first gas supply unit 14a and the second gas supply unit 14b by the control of the control unit Cnt.

[Plasma Source]

Figure 5:
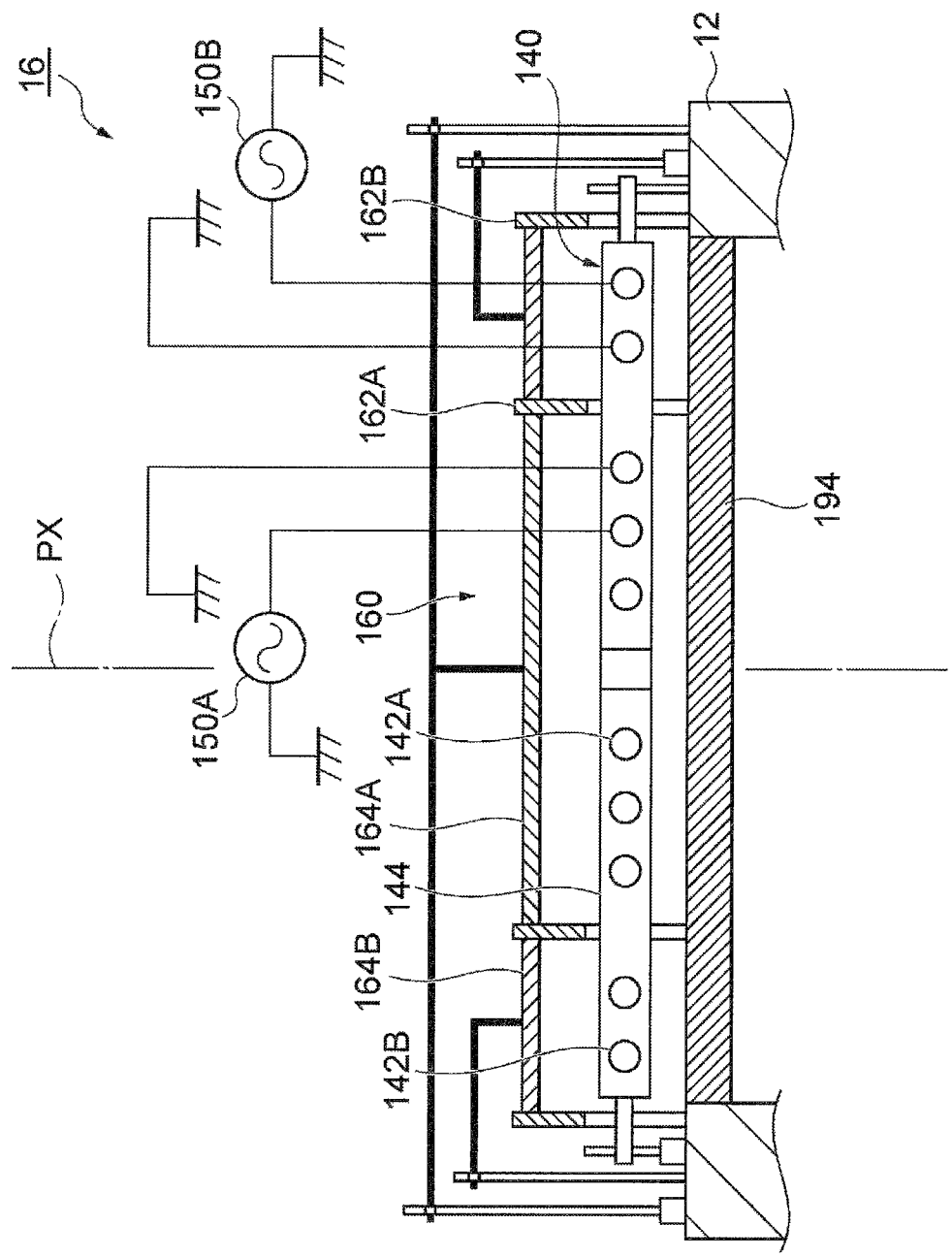
FIG. 5 is a view illustrating a plasma source according to one exemplary embodiment.
Figure 6:
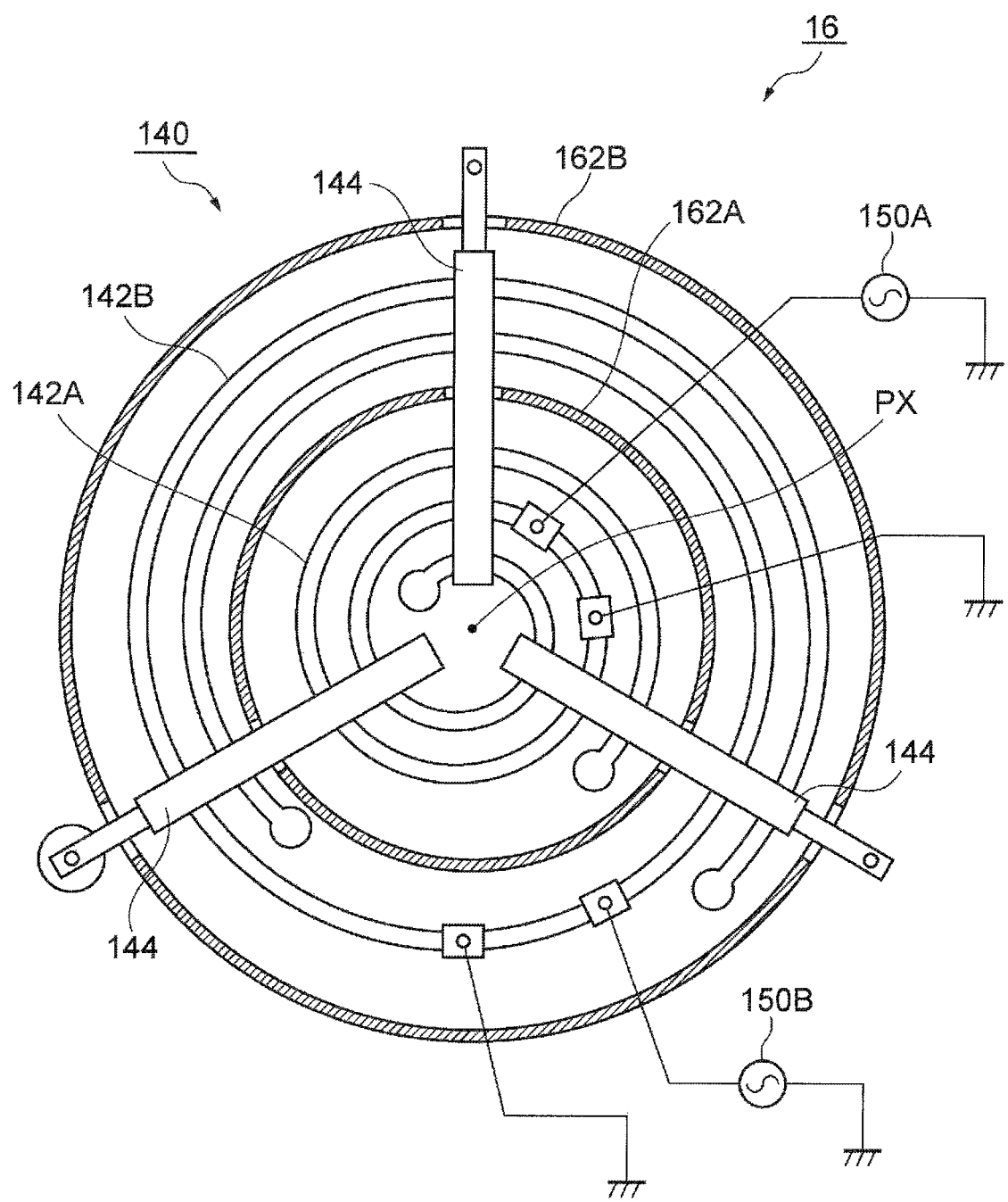
FIG. 6 is a view illustrating the plasma source according to the exemplary embodiment.

FIG. 5 is a view illustrating the plasma source according to one exemplary embodiment, and illustrates the plasma source viewed from the Y direction in FIG. 1. In addition, FIG. 6 is a view illustrating the plasma source according to one exemplary embodiment, and illustrates the plasma source viewed from the vertical direction. As illustrated in FIG. 1 and FIG. 5, an opening is formed in the ceiling portion of the processing container 12, and the opening is closed by the dielectric plate 194. The dielectric plate 194 is a plate-shaped body, and is formed of quartz glass or ceramic. The plasma source 16 is provided on the dielectric plate 194.

More specifically, as illustrated in FIGS. 5 and 6, the plasma source 16 includes a high-frequency antenna 140 and a shield member 160. The high-frequency antenna 140 is covered with a shield member 160. In one exemplary embodiment, the high-frequency antenna 140 includes an inner antenna element 142A and an outer antenna element 142B. The inner antenna element 142A is provided closer to the axis PX than the outer antenna element 142B. In other words, the outer antenna element 142B is provided at the outside of the inner antenna element 142A so as to surround the inner antenna element 142A. Each of the inner antenna element 142A and the outer antenna element 142B is formed of a conductor such as, for example, copper, aluminum, or stainless steel, and extends in a spiral shape around the axis PX.

Both of the inner antenna element 142A and the outer antenna element 142B are sandwiched by a plurality of holding members 144 and are integrated with each other. The plurality of holding members 144 are, for example, rod-shaped members, and are disposed radially with respect to the axis PX.

The shield member 160 includes an inner shield wall 162A and an outer shield wall 162B. The inner shield wall 162A has a cylindrical shape extending in the vertical direction, and is provided between the inner antenna element 142A and the outer antenna element 142B. The inner shield wall 162A surrounds the inner antenna element 142A. In addition, the outer shield wall 162B has a tubular shape extending in the vertical direction, and is provided so as to surround the outer antenna element 142B.

An inner shield plate 164A is provided on the inner antenna element 142A. The inner shield plate 164A has a disc shape, and is provided so as to close an opening in the inner shield wall 162A. In addition, an outer shield plate 164B is provided on the outer antenna element 142B. The outer shield plate 164B is an annular plate, and is provided so as to close an opening between the inner shield wall 162A and the outer shield wall 162B.

A high-frequency power supply 150A and a high-frequency power supply 150B are connected to the inner antenna element 142A and the outer antenna element 142B, respectively. The high-frequency power supply 150A and the high-frequency power supply 150B are high-frequency power supplies for plasma generation. The high-frequency power supply 150A and the high-frequency power supply 150B supply a high-frequency power of the same frequency or different frequencies to the inner antenna element 142A and the outer antenna element 142B, respectively. For example, when a predetermined high frequency (e.g., 40 MHz) power is supplied from the high-frequency power supply 150A to the inner antenna element 142A, by the induction magnetic field formed in the processing container 12a, the processing gas introduced into the processing container 12 is excited, and donut-shaped plasma is generated in the center portion of the wafer W. In addition, when a predetermined high-frequency (e.g., 60 MHz) power is supplied from the high-frequency power supply 150B to the outer antenna element 142B, by the induction magnetic field formed in the processing container 12, the processing gas introduced into the processing container 12 is excited, and another donut-shaped plasma is generated on the peripheral portion of the wafer W. These plasmas generate the radical from the processing gas.

In addition, the frequency of the high-frequency power output from the high-frequency power supply 150A and the high-frequency power supply 150B is not limited to the above-described frequency. For example, the frequencies of the high-frequency power output from the high-frequency power supply 150A and the high-frequency power supply 150B may be various frequencies such as 13.56 [MHz], 27 [MHz], 40 [MHz], and 60 [MHz]. However, it is necessary to adjust the electrical lengths of the inner antenna element 142A and the outer antenna element 142B according to the high frequency output from the high-frequency power supply 150A and the high-frequency power supply 150B.

The plasma source 16 may ignite the plasma of the processing gas even under an environment of a pressure of 1 [mTorr] (0.1333 [Pa]). Under the low pressure environment, the mean free path of the ions in the plasma becomes large. Therefore, etching of ions of the rare gas atoms by sputtering becomes possible. In addition, under a low pressure environment, it is possible to evacuate the etched material while suppressing reattachment of the etched material to the wafer W.

[Holding Structure]

Figure 7:
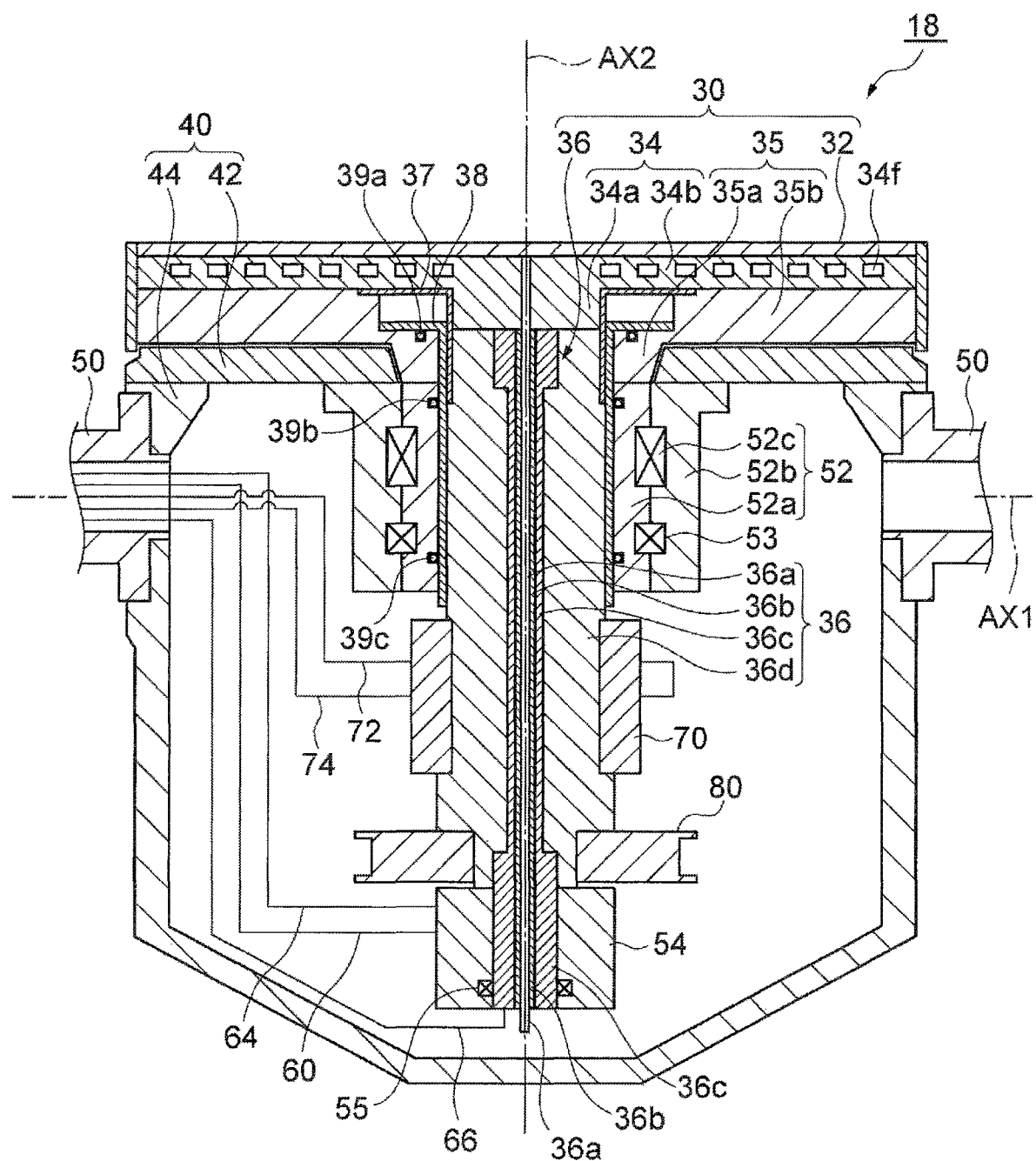
FIG. 7 is a cross-sectional view illustrating a holding structure according to one exemplary embodiment.
Figure 8:
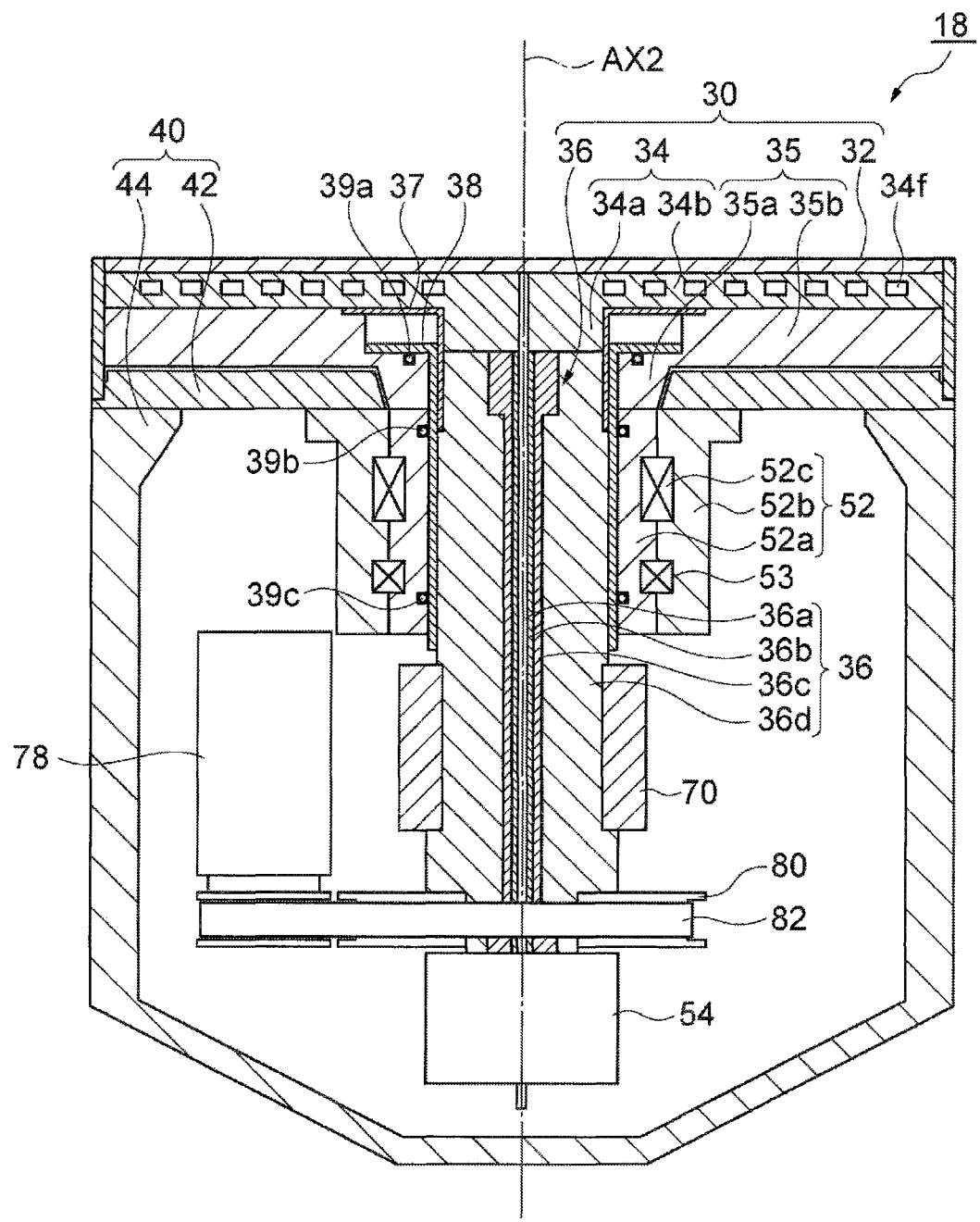
FIG. 8 is a cross-sectional view illustrating a holding structure according to one exemplary embodiment.

FIGS. 7 and 8 are cross-sectional views illustrating the holding structure according to one exemplary embodiment. FIG. 7 is a cross-sectional view of the holding structure viewed from the Y direction (see FIG. 1), and FIG. 8 is a cross-sectional view of the holding structure viewed from the X direction (see FIG. 1). As illustrated in FIGS. 7 and 8, the holding structure 18 includes the holding unit 30, a container unit 40, and the inclination shaft unit 50.

The holding unit 30 is a mechanism that holds the wafer W and rotates around the second axis AX2 to rotate the wafer W. In addition, as described above, the second axis AX2 coincides with the axis PX in a state where the holding structure 18 is not inclined. The holding unit 30 includes an electrostatic chuck 32, a lower electrode 34, a rotating shaft 36, and an insulating member 35.

The electrostatic chuck 32 is configured to hold the wafer W on an upper surface 32a thereof. The electrostatic chuck 32 has an approximately disk shape having the second axis AX2 as the central axis thereof, and has an electrode film formed as an inner layer of an insulating film. The electrostatic chuck 32 generates an electrostatic force when a voltage is applied to the electrode film. By this electrostatic force, the electrostatic chuck 32 attracts the wafer W placed on the upper surface 32a thereof. A heat transfer gas such as a He gas is supplied between the electrostatic chuck 32 and the wafer W. In addition, a heater for heating the wafer W may be mounted in the electrostatic chuck 32. The electrostatic chuck 32 is provided on the lower electrode 34.

The lower electrode 34 has an approximately disk shape having the second axis AX2 as the central axis thereof. In one exemplary embodiment, the lower electrode 34 includes a first portion 34a and a second portion 34b. The first portion 34a is the center side portion of the lower electrode 34 extending along the second axis AX2, and the second portion 34b is a portion that is located farther away from the second axis AX2 than the first portion 34a, that is, that extends at the outside of the first portion 34a. The upper surface of the first portion 34a and the upper surface of the second portion 34b are continuous, and the upper surface of the first portion 34a and the upper surface of the second portion 34b constitute a substantially flat upper surface of the lower electrode 34. The electrostatic chuck 32 is in contact with the upper surface of the lower electrode 34. In addition, the first portion 34a protrudes downward from the second portion 34b, and has a cylindrical shape. That is, the lower surface of the first portion 34a extends below the lower surface of the second portion 34b. The lower electrode 34 is formed of a conductor such as aluminum. The lower electrode 34 is electrically connected to the above-described bias power supply unit 22. That is, the modulated DC voltage from the first power supply 22a and the high-frequency bias power from the second power supply 22b may be selectively supplied to the lower electrode 34. In addition, the lower electrode 34 is formed with a coolant flow path 34f. The temperature of the wafer W is controlled by supplying a coolant to the coolant flow path 34f. The lower electrode 34 is provided on the insulating member 35.

The insulating member 35 is formed of an insulator such as quartz or alumina, and has an approximately disc shape having an opened center. In one exemplary embodiment, the insulating member 35 includes a first portion 35a and a second portion 35b. The first portion 35a is the center side portion of the insulating member 35, and the second portion 35b is the portion that is located farther away from the second axis AX2 than the first portion 35a, that is, that extends at the outside of the first portion 35a. The upper surface of the first portion 35a extends below the upper surface of the second portion 35b, and the lower surface of the first portion 35a also extends below the lower surface of the second portion 35b. The upper surface of the second portion 35b of the insulating member 35 is in contact with the lower surface of the second portion 34b of the lower electrode 34. On the other hand, the upper surface of the first portion 35a of the insulating member 35 is spaced apart from the lower surface of the lower electrode 34.

The rotating shaft 36 has an approximately cylindrical shape and is coupled to the lower surface of the lower electrode 34. Specifically, the rotating shaft 36 is coupled to the lower surface of the first portion 34a of the lower electrode 34. The central axis of the rotating shaft 36 coincides with the second axis AX2. A rotating force is applied to the rotating shaft 36, so that the holding unit 30 rotates.

The holding unit 30, constituted by such various elements, forms a hollow space as the inner space of the holding structure 18 together with the container unit 40. The container unit 40 includes an upper container portion 42 and an outer container portion 44. The upper container part 42 has an approximately disk shape. A through hole, through which the rotating shaft 36 passes, is formed in the center of the upper container portion 42. The upper container portion 42 is provided below the second portion 35b of the insulating member 35 so as to provide a slight gap with respect to the second portion 35b. In addition, the upper end of the outer container portion 44 is coupled to a lower peripheral edge of the upper container portion 42. The outer container portion 44 has an approximately cylindrical shape having a closed lower end.

A magnetic fluid seal unit 52 is provided between the container unit 40 and the rotating shaft 36. The magnetic fluid seal unit 52 includes an inner ring unit 52a and an outer ring unit 52b. The inner ring unit 52a has an approximately cylindrical shape to extend coaxially with the rotating shaft 36, and is fixed to the rotating shaft 36. In addition, the upper end portion of the inner ring unit 52a is coupled to the lower surface of the first portion 35a of the insulating member 35. The inner ring unit 52a is configured to rotate together with the rotating shaft 36 around the second axis AX2. The outer ring unit 52b has an approximately cylindrical shape, and is provided coaxially with the inner ring unit 52a at the outside of the inner ring unit 52a. The upper end portion of the outer ring unit 52b is coupled to the lower surface of the center side portion of the upper container part 42. A magnetic fluid 52c is interposed between the inner ring unit 52a and the outer ring unit 52b. In addition, a bearing 53 is provided between the inner ring unit 52a and the outer ring unit 52b below the magnetic fluid 52c. The magnetic fluid seal unit 52 provides a sealing structure for airtightly sealing the inner space of the holding structure 18. With the magnetic fluid seal unit 52, the inner space of the holding structure 18 is separated from the space S of the plasma processing apparatus 10. In addition, in the plasma processing apparatus 10, the inner space of the holding structure 18 is maintained at the atmospheric pressure.

In one exemplary embodiment, a first member 37 and a second member 38 are provided between the magnetic fluid seal unit 52 and the rotating shaft 36. The first member 37 has an approximately cylindrical shape to extend along a portion of the outer peripheral surface of the rotating shaft 36, that is, along the outer peripheral surface of the upper portion of a third tubular portion 36d to be described later and the outer peripheral surface of the first portion 34a of the lower electrode 34. In addition, the upper end of the first member 37 has an annular plate shape to extend along the lower surface of the second portion 34b of the lower electrode 34. The first member 37 is in contact with the outer peripheral surface of the upper portion of the third tubular portion 36d, the outer peripheral surface of the first portion 34a of the lower electrode 34, and the lower surface of the second portion 34b.

The second member 38 has an approximately cylindrical shape to extend along the outer peripheral surface of the rotating shaft 36, that is, the outer peripheral surface of the third tubular portion 36d and the outer peripheral surface of the first member 37. The upper end of the second member 38 has an annular plate shape to extend along the upper surface of the first portion 35a of the insulating member 35. The second member 38 is in contact with the outer peripheral surface of the third tubular portion 36d, the outer peripheral surface of the first member 37, the upper surface of the first portion 35a of the insulating member 35, and the inner peripheral surface of the inner ring unit 52a of the magnetic fluid seal unit 52. A sealing member 39a such as an O-ring is interposed between the second member 38 and the upper surface of the first portion 35a of the insulating member 35. In addition, a sealing member 39b such as an O-ring and a sealing member 39c are interposed between the second member 38 and the inner peripheral surface of the inner ring unit 52a of the magnetic fluid seal unit 52. With such a structure, the space between the rotating shaft 36 and the inner ring unit 52a of the magnetic fluid seal unit 52 is sealed. Thereby, even if there is a gap between the rotating shaft 36 and the magnetic fluid sealing unit 52, the inner space of the holding structure 18 is separated from the space S of the plasma processing apparatus 10.

An opening is formed in the outer container portion 44 along the first axis AX1. The inner end portion of the inclination shaft unit 50 is fitted into the opening formed in the outer container portion 44 via a connecting portion 12b. The connecting portion 12b has a bellows shape and is flexible. The connecting portion 12b may maintain airtightness in the processing container 12. The inclination shaft unit 50 has an approximately cylindrical shape, and the central axis thereof coincides with the first axis AX1. As illustrated in FIG. 1, the inclination shaft unit 50 extends to the outside of the processing container 12. Both outer end portions of the inclination shaft unit 50 are coupled to the above-described driving device 24. The driving device 24 pivotally supports both the outer end portions of the inclination shaft unit 50. As the inclination shaft unit 50 is rotated by the driving device 24, the holding structure 18 rotates around the first axis AX1, and as a result, the holding structure 18 is inclined with respect to the axis PX. For example, the holding structure 18 may be inclined so that the value φ [Deg.] of the inclination angle AN of the second axis AX2 relative to the axis PX forms an angle within the range of at least 0 to 60 [Deg.], but the value φ [Deg.] of the inclination angle AN of the second axis AX2 is not limited to the range of 0 to 60 [Deg.] and the holding structure 18 may be inclined within the range of 0 to 360 [Deg.] in a mode in which the wafer W is disposed in an environment exposed to the plasma (that is, the holding structure 18 may rotate once about the first axis AX1).

The inclination shaft unit 50 is configured such that it may perform parallel movement between the ceiling side and the bottom portion side along the axis PX, without changing the direction of the inclination shaft unit 50 (the first axis AX1), by the connecting portion 12b, which has a bellows shape and is flexible, and the driving device 24. Despite this parallel movement of the inclination shaft unit 50 along the axis PX, the first axis AX1, which is the central axis of the inclination shaft unit 50, is also orthogonal to the axis PX, intersects the axis PX, and is included in the ZX plane. Due to the parallel movement of the inclination shaft unit 50, the intersection point XO of the axis PX, the first axis AX1, and the second axis AX2 moves along the axis PX. That is, in the processing container 12, the position of the intersection point XO of the second axis AX2 and the axis PX may be moved along the axis PX. Due to the parallel movement of the inclination shaft unit 50 (the first axis AX1), the distance L between the intersection point XO and the horizontal reference plane FA1 increases or decreases.

In one exemplary embodiment, the first axis AX1 includes the center position of the holding structure 18 in the second axis AX2 direction. In this exemplary embodiment, the inclination shaft unit 50 extends on a first axis AX1, which passes through the center of the holding structure 18.

In another exemplary embodiment, the first axis AX1 includes a position between the center of the holding structure 18 in the direction of the second axis AX2 and the upper surface of the holding unit 30. That is, in this exemplary embodiment, the inclination shaft unit 50 extends at a position biased toward the holding unit 30 side from the center of the holding structure 18. According to the exemplary embodiment, when the holding structure 18 is inclined, the difference in distance from the plasma source 16 to each position of the wafer W may be reduced. Therefore, in-plane uniformity of etching is further improved.

In yet another exemplary embodiment, the first axis AX1 includes the center of gravity of the holding structure 18. In the exemplary embodiment, the inclination shaft unit 50 extends on the first axis AX1 including the center of gravity. According to the exemplary embodiment, a torque required for the driving device 24 is reduced, and the driving device 24 is easily controlled.

Returning to FIGS. 7 and 8, a wiring for various electrical systems, a piping for a heat transfer gas, and a piping for a coolant pass through inner holes in the inclination shaft unit 50. These wiring and piping are connected to the rotating shaft 36.

The rotating shaft 36 has a columnar portion 36a, a first tubular portion 36b, a second tubular portion 36c, and a third tubular portion 36d. The columnar portion 36a has an approximately cylindrical shape, and extends on the second axis AX2. The columnar portion 36a is a wiring for applying a voltage to an electrode film of the electrostatic chuck 32. The columnar portion 36a is connected to the wiring 60 via a rotary connector 54 such as a slip ring. The wiring 60 extends from the inner space of the holding structure 18 to the outside of the processing container 12 through the inner hole in the inclination shaft unit 50. This wiring 60 is connected to a power supply 62 (see FIG. 1) via a switch outside the processing container 12.

The first tubular portion 36b is provided coaxially with the columnar portion 36a at the outside of the columnar portion 36a. The first tubular portion 36b is a wiring for supplying a modulated DC voltage and a high-frequency bias power to the lower electrode 34. The first tubular portion 36b is connected to a wiring 64 via the rotary connector 54. The wiring 64 extends from the inner space of the holding structure 18 to the outside of the processing container 12 through the inner hole in the inclination shaft unit 50. The wiring 64 is connected to the first power supply 22a and the second power supply 22b of the bias power supply unit 22 outside the processing container 12. In addition, a matcher for impedance matching may be provided between the second power supply 22b and the wiring 64.

The second tubular portion 36c is provided coaxially with the first tubular portion 36b at the outside of the first tubular portion 36b. In one exemplary embodiment, a bearing 55 is provided in the rotary connector 54 described above, and the bearing 55 extends along the outer peripheral surface of the second tubular portion 36c. The bearing 55 supports the rotating shaft 36 via the second tubular portion 36c. The above-described bearing 53 supports the upper portion of the rotating shaft 36, whereas the bearing 55 supports the lower portion of the rotating shaft 36. Since the rotating shaft 36 is supported on both the upper portion and the lower portion thereof by the two bearings 53 and 55 in this way, it is possible to stably rotate the rotating shaft 36 around the second axis AX2.

A gas line for supplying a heat transfer gas is formed in the second tubular portion 36c. This gas line is connected to a pipe 66 via a rotary joint such as a swivel joint. The pipe 66 extends from the inner space of the holding structure 18 to the outside of the processing container 12 through the inner hole in the inclination shaft unit 50. The pipe 66 is connected to a heat transfer gas source 68 (see FIG. 1) outside the processing container 12.

The third tubular portion 36d is provided coaxially with the second tubular portion 36c at the outside of the second tubular portion 36c. A coolant supply line for supplying a coolant to the coolant flow path 34f and a coolant recovery line for recovering the coolant supplied to the coolant flow path 34f are formed in the third tubular portion 36d. The coolant supply line is connected to a pipe 72 via a rotary joint 70 such as a swivel joint. In addition, the coolant recovery line is connected to a pipe 74 via the rotary joint 70. The pipe 72 and the pipe 74 extend from the inner space of the holding structure 18 to the outside of the processing container 12 through the inner hole in the inclination shaft unit 50. Then, the pipe 72 and the pipe 74 are connected to a chiller unit 76 (see FIG. 1) outside the processing container 12.

In addition, as illustrated in FIG. 8, a rotation motor 78 is provided in the inner space of the holding structure 18. The rotation motor 78 generates a driving force for rotating the rotating shaft 36. In one exemplary embodiment, the rotation motor 78 is provided on the lateral side of the rotating shaft 36. The rotation motor 78 is connected to a pulley 80, which is attached to the rotating shaft 36, via a conduction belt 82. Thereby, a rotational driving force of the rotation motor 78 is transmitted to the rotating shaft 36, and the holding unit 30 rotates around the second axis AX2. The number of revolutions of the holding unit 30 is, for example, within the range of 50 [rpm] or less. For example, the holding unit 30 is rotated at the number of revolutions of 10 [rpm] during a process. In addition, a wiring for supplying electric power to the rotation motor 78 is discharged to the outside of the processing container 12 through the inner hole in the inclination shaft unit 50, and is connected to a motor power supply that is provided at the outside of the processing container 12. In the following description, unless otherwise mentioned, it is assumed that the number of revolutions [rpm] of the holding unit 30 has the same value (e.g., 10 [rpm]).

In this manner, the holding structure 18 may provide various mechanisms in the inner space that may be maintained at the atmospheric pressure. In addition, the holding structure 18 is configured such that a wiring or piping for connecting a mechanism accommodated in the inner space thereof to a device such as, for example, a power supply, a gas source, or a chiller unit provided outside the processing container 12 is dischargeable to the outside of the processing container 12. In addition to the above-described wiring and piping, a wiring for connecting a heater power supply provided outside the processing container 12 and the heater provided on the electrostatic chuck 32 may be discharged from the inner space of the holding structure 18 to the outside of the processing container 12 through the inner hole in the inclination shaft unit 50.

In addition, during the etching of the respective layers of the multilayer film illustrated in FIG. 4, a material (that is, metal), which is scraped off by etching, is not evacuated, and is attached to the surface, particularly the side surface having a shape formed by etching. With the plasma processing apparatus 10, when the deposit formed on the side surface is thus removed, the holding structure 18 is inclined, and the holding portion 30 holding the wafer W may be rotated about the second axis AX2. Thereby, ions may be introduced into the entire region of the side surface of the shape formed by etching, and it is possible to improve the in-plane uniformity of the introduction of ions on the wafer W. As a result, it is possible to remove the deposit attached to the side surface in the entire region of the side surface having the shape formed by etching, and it is possible to enhance the verticality of the shape. In addition, it is possible to uniformly perform the removal of the deposit in the plane of the wafer W, and to improve the in-plane uniformity of the shape formed by etching.

Figure 9:
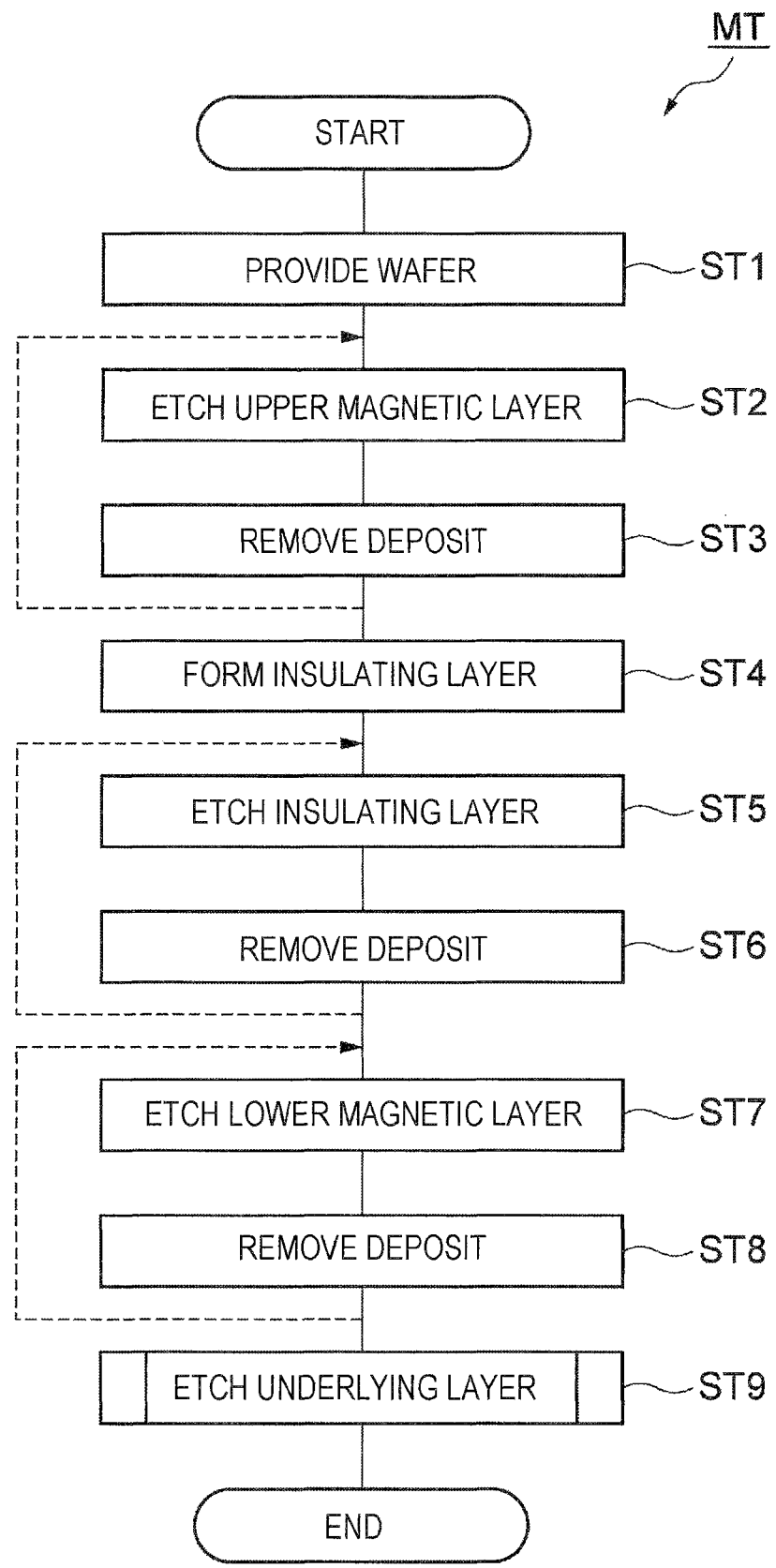
FIG. 9 is a flowchart illustrating a method of etching a multilayer film according to one exemplary embodiment.

Hereinafter, an exemplary embodiment of a method of etching the multilayer film of the wafer W illustrated in FIG. 4 will be described in FIG. 4. FIG. 9 is a flowchart illustrating a method of etching a multilayer film according to one exemplary embodiment. The method MT illustrated in FIG. 9 may be carried out using the plasma processing apparatus 10 illustrated in FIG. 1. The method MT is a method of etching the multilayer film of the wafer W, which is a workpiece, by using the plasma processing apparatus 10. More specifically, the method MT is to etch each layer in the multilayer film of the wafer W illustrated in FIG. 4 by using ions having energy suitable for the etching.

The method MT illustrated in FIG. 9 at least partially utilizes the above-described characteristics described with reference to FIGS. 14A, 14B, and 15. Hereinafter, the method MT will be described in detail with reference to FIGS. 10A and 10B to FIGS. 14A and 14B, in addition to FIG. 9. FIGS. 10A and 10B to FIGS. 14A and 14B are cross-sectional views illustrating a state of the workpiece during or after each step of the method MT. In addition, in the following description, it is assumed that the plasma processing apparatus 10 is used to implement the method MT. However, any other arbitrary plasma processing apparatus may be used to implement the method MT as long as it is a plasma processing apparatus that may inclined the holding structure and rotate the holding unit holding the wafer W, and may also apply the modulated DC voltage from the bias power supply unit to the holding structure.

In the method MT, first, in a process ST1, the wafer W illustrated in FIG. 4 is prepared and accommodated in the processing container 12 of the plasma processing apparatus 10. Then, the wafer W is held by the electrostatic chuck 32 of the holding unit 30.

In a subsequent process ST2, the upper magnetic layer L4 is etched. In the process ST2, a rare gas and a hydrogen-containing gas are supplied into the processing container 12. In one exemplary embodiment, the rare gas is a rare gas having an atomic number greater than the atomic number of argon, and, for example, a Kr gas. In addition, the hydrogen-containing gas is, for example, a $CH_4$ gas or $NH_3$ gas.

In addition, in the process ST2, the pressure in the space S in the processing container 12 is reduced to a predetermined pressure by the exhaust system 20. For example, the pressure in the space S in the processing container 12 is set to a pressure within the range of 0.4 [mTorr] (0.5 [Pa]) to 20 [mTorr] (2.666 [Pa]). In addition, in the process ST2, the rare gas and the hydrogen-containing gas are excited by the plasma source 16. Therefore, the high-frequency power supply 150A and the high-frequency power supply 150B of the plasma source 16 supply a high-frequency power with a frequency, for example, 27.12 [MHz] or 40.68 [MHz] and a power value within the range from 10 to 3000 [W] to the inner antenna element 142A and the outer antenna element 142B. In addition, in the process ST2, the modulated DC voltage is applied to the holding structure 18 (the lower electrode 34). The voltage value of the DC voltage is set to a relatively low voltage value in order to suppress etching of the mask MSK and the insulating layer L3. For example, the voltage value of the DC voltage is set to a voltage value of 300 [V] or less, for example 200 [V]. In addition, the modulated frequency of the DC voltage is set to, for example, 400 [kHz]. In addition, the on-duty ratio of the pulse modulation of the DC voltage is set to a ratio within the range of 10% to 90%.

In the process ST2, the ions generated under the above-described condition are accelerated by a sheath generated by the modulated DC voltage, and are introduced into the upper magnetic layer L4. The energy of the ions etches the upper magnetic layer L4 formed of Co and Fe, but does not substantially etch the mask MSK formed of Ta and TiN and the insulating layer L3 formed of MgO. Therefore, in the process ST2, the upper magnetic layer L4 may be selectively etched with respect to the mask MSK and the insulating layer L3. In addition, in the process ST2, the active species of hydrogen derived from the hydrogen-containing gas reforms the surface of the upper magnetic layer L4. Thereby, the etching of the upper magnetic layer L4 is promoted. In addition, in the process ST2, a metal compound is formed by a reaction of nitrogen or carbon in the hydrogen-containing gas with the mask MSK. Thereby, the mask MSK is strengthened, and etching of the mask MSK is suppressed.

Figure 10A:
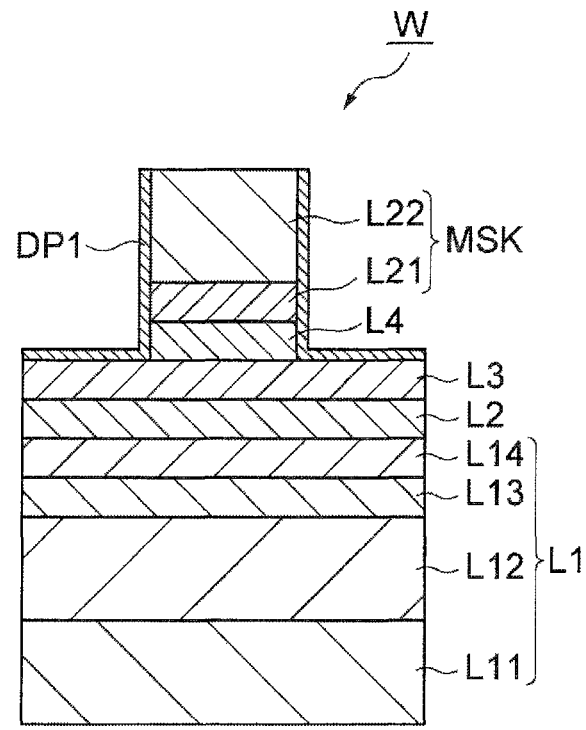
FIGS. 10A and 10B are cross-sectional views illustrating a state of the workpiece during or after each step of the method MT.

As a result of execution of such a process ST2, the upper magnetic layer L4 is etched as illustrated in FIG. 10A, but constituent materials of the upper magnetic layer L4, for example, Co and Fe, may not be evacuated, but may be attached to the surface of the wafer W. For example, the constituent material is attached to the side surface of the mask MSK, the side surface of the upper magnetic layer L4, and the upper surface of the insulating layer L3. As a result, a deposit DP1 is formed as illustrated in FIG. 10A.

In addition, in the process ST2, a process of rotating the holding structure 18 to be described later is performed together in a period during which the upper magnetic layer L4 is etched under the above condition. In the following processes ST5, ST7, and ST92, as well as in a case of the process ST2, a process of rotating the holding structure 18 to be described later is carried out within a period during which etching of each process is performed. The process of rotating the holding structure 18 will be described in detail later.

Figure 10B:
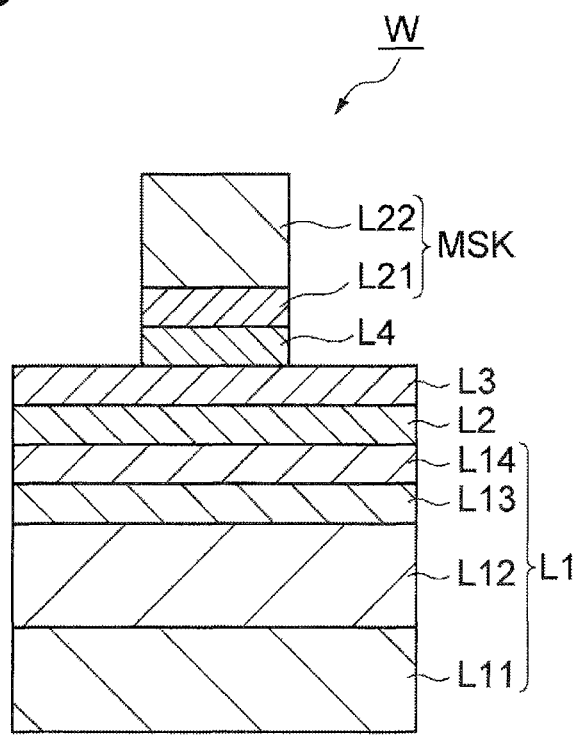

In a subsequent process ST3, the deposit DP1 is removed. The condition of the process ST3 may be the same as the condition of the process ST2. That is, in the process ST3, a rare gas having an atomic number larger than the atomic number of argon, for example, a Kr gas and a hydrogen-containing gas are supplied into the processing container 12. In addition, the rare gas and hydrogen gas are excited by the plasma source 16. In addition, in the process ST3, the modulated DC voltage is applied to the holding structure 18 (the lower electrode 34). Therefore, as illustrated in FIG. 10B, the deposit DP1 is removed in the entire region of the side face of the upper magnetic layer L4 and the entire region of the side face of the mask MSK. In addition, in the process ST3, the active species of hydrogen derived from the hydrogen-containing gas reforms the deposit DP1. This promotes the removal of the deposit DP1.

In addition, the process ST2 and the process ST3 may be alternately executed multiple times. This makes it possible to etch the upper magnetic layer L4 while removing the deposit DP1 before a large amount of the deposit DP1 is formed.

Figure 11A:
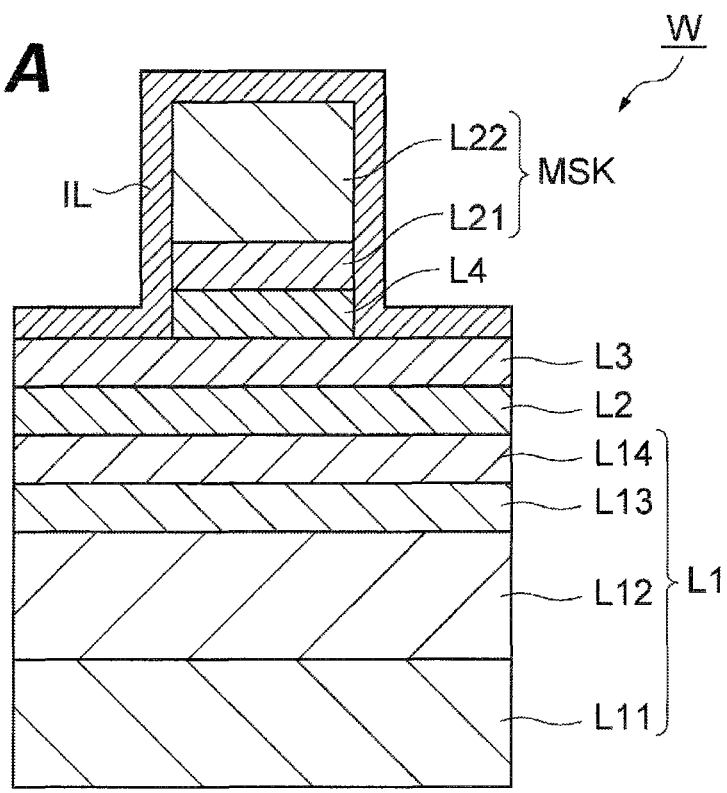
FIGS. 11A and 11B are cross-sectional views illustrating a state of the workpiece during or after each step of the method MT.
Figure 11B:
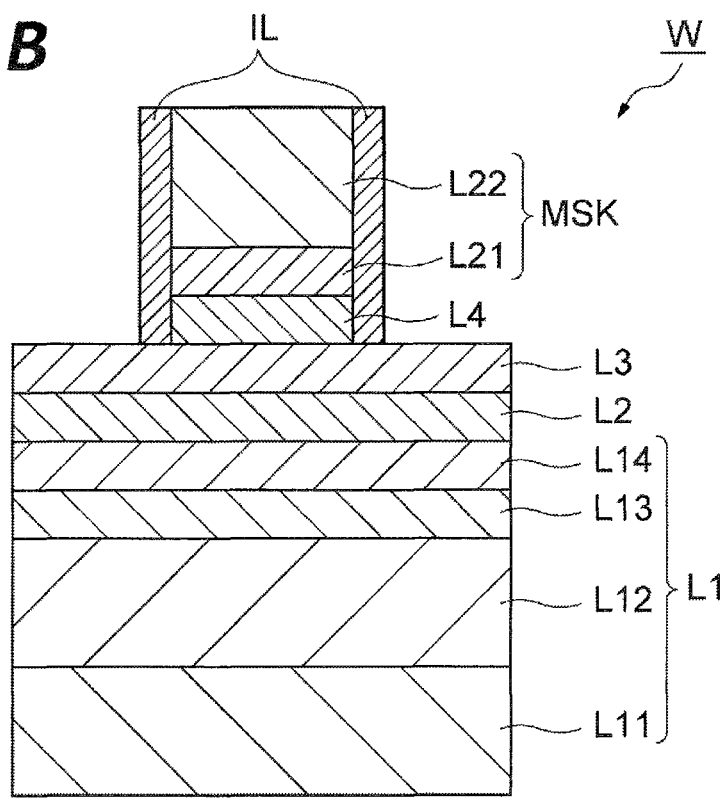

In a subsequent process ST4, an insulating film IL is formed. The insulating film IL is formed to prevent conduction between the lower magnetic layer L2 and the upper magnetic layer L4. Specifically, in the process ST4, the wafer W is transferred to a film forming apparatus, and the insulating film IL is formed on the surface of the wafer W in the film forming apparatus as illustrated in FIG. 11A. The insulating film IL may be formed of, for example, a silicon nitride or silicon oxide. Next, the insulating film IL is etched in a region along the upper surface of the mask MSK and in a region along the upper surface of the insulating layer L3. For example, an arbitrary plasma processing apparatus may be used for this etching. For example, the plasma processing apparatus 10 may be used for this etching. In addition, for this etching, a processing gas containing a hydrofluorocarbon gas or a fluorocarbon gas may be used. As a result of this etching, as illustrated in FIG. 11B, the insulating film IL is left along the side surface of the mask MSK and the side surface of the upper magnetic layer L4.

In a subsequent process ST5, the insulating layer L3 is etched. In the process ST5, a rare gas and a hydrogen-containing gas are supplied into the processing container 12. The rare gas is a rare gas having an atomic number larger than the atomic number of argon, for example, a Kr gas. In addition, the hydrogen containing gas is, for example, a $CH_4$ gas or $NH_3$ gas. In addition, in the process ST5, the pressure in the space S in the processing container 12 is reduced to a predetermined pressure by the exhaust system 20. For example, the pressure in the space S in the processing container 12 is set to a pressure within the range of 0.4 [mTorr] (0.5 [Pa]) to 20 [mTorr] (2.666 [Pa]). In addition, in the process ST5, the rare gas and the hydrogen containing gas are excited by the plasma source 16. Therefore, the high-frequency power supply 150A and the high-frequency power supply 150B of the plasma source 16 supply a high-frequency power with a frequency of, for example, 27.12 [MHz] or 40.68 [MHz], and a power value within the range from 10 to 3000 [W] to the inner antenna element 142A and the outer antenna element 142B.

As described above, in the etching of the insulating layer L3, ions of relatively high ion energy need to be introduced into the wafer W. Therefore, in the process ST5, a modulated DC voltage or a high-frequency bias power having a voltage value higher than the modulated DC voltage applied to the holding structure 18 (the lower electrode 34) in the process ST2 is applied to the holding structure (the lower electrode 34). When the modulated DC voltage is used, the on-duty ratio and the frequency of pulse modulation of the modulated DC voltage may be the same as the on-duty ratio and the frequency of pulse modulation of the DC voltage in the process ST2, but the voltage value of the DC voltage is set to a voltage value larger than 300 [V]. On the other hand, when a high-frequency bias power is used, the high-frequency bias power is set to 100 to 1500 [W] and the frequency thereof may be set to 400 [kHz].

Figure 12A:
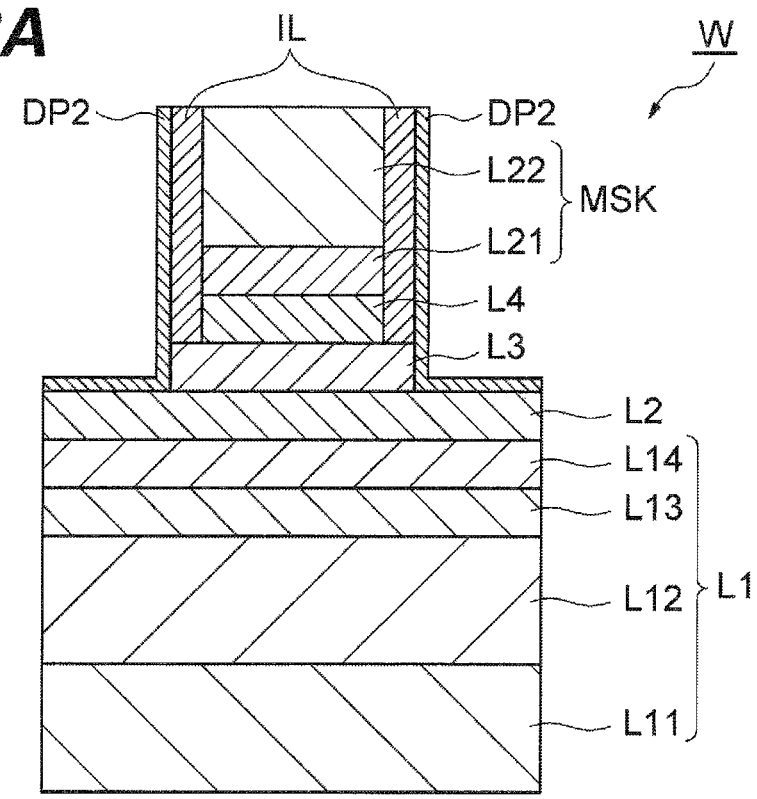
FIGS. 12A and 12B are cross-sectional views illustrating a state of the workpiece during or after each step of the method MT.

In the process ST5, the ions generated under the above-described conditions are introduced into the insulating layer L3. The ions may have energy capable of etching the insulating layer L3. In addition, the constituent material of the insulating layer L3 is reduced by the active species of hydrogen derived from the hydrogen containing gas used in the process ST5. For example, MgO is reduced. Accordingly, as described with reference to FIGS. 14A and 14B, the insulating layer L3 is reformed so as to obtain a high sputtering yield SY. As a result, the etching rate [μm/min] of the insulating layer L3 is increased. By the process ST5, the insulating layer L3 is etched as illustrated in FIG. 12A. In the process ST5, the constituent material of the insulating layer L3 may be attached to the surface of the wafer W without being evacuated. For example, the constituent material is attached to the side surface of the mask MSK, the side surface of the upper magnetic layer L4, the side surface of the insulating layer L3, and the surface of the lower magnetic layer L2. As a result, a deposit DP2 is formed.

Figure 12B:
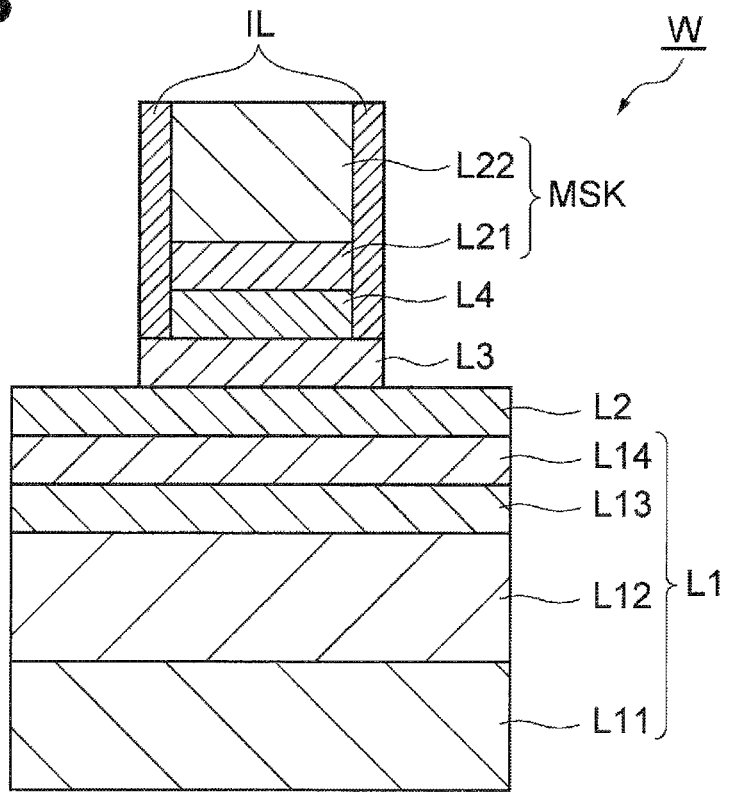

In a subsequent process ST6, the deposit DP2 is removed. The condition of the process ST6 is the same as the condition of the process ST5. According to the process ST6, since the ions may be efficiently introduced into the deposit DP2, it is possible to remove the deposit DP2 as illustrated in FIG. 12B. In addition, by using the hydrogen-containing gas, it is possible to reform the deposit DP2 so as to promote the removal of the deposit DP2.

In addition, the process ST5 and the process ST6 may be alternately executed multiple times. This makes it possible to etch the insulating layer L3 while removing the deposit DP2 before a large amount of the deposit DP2 is formed.

Figure 13A:
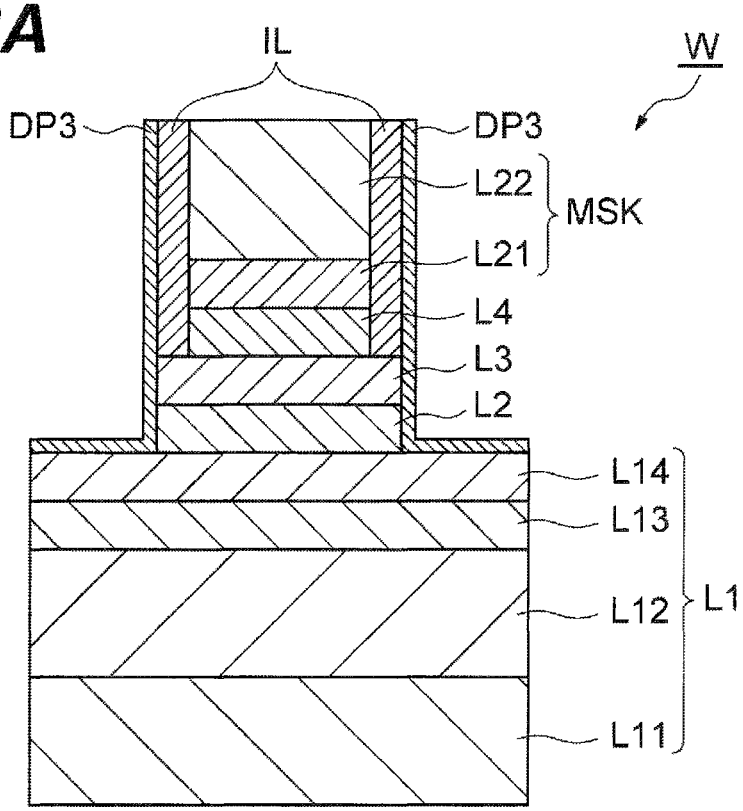
FIGS. 13A and 13B are cross-sectional views illustrating a state of the workpiece during or after each step of the method MT.
Figure 13B:
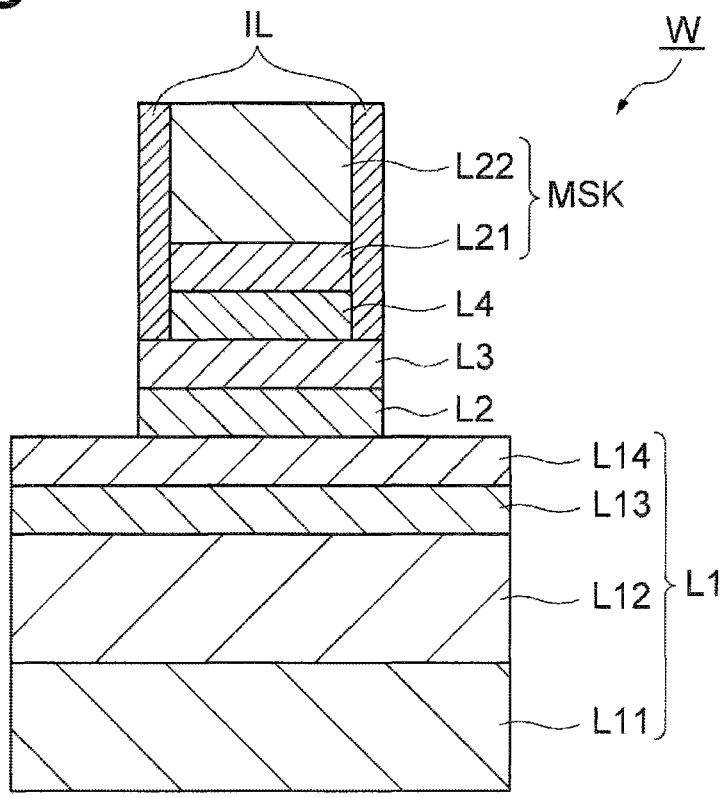
Figure 14A:
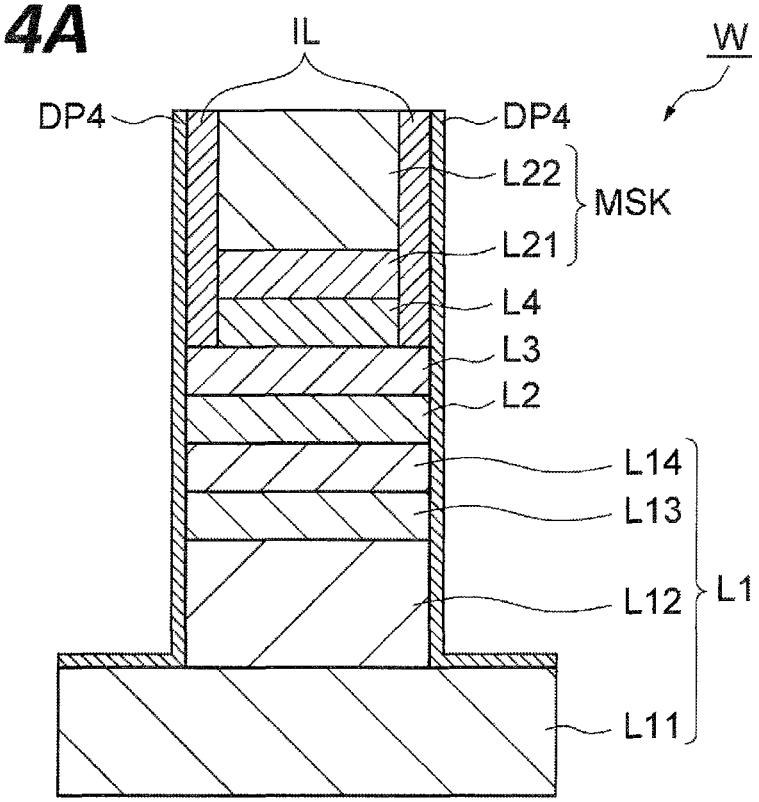
FIGS. 14A and 14B are cross-sectional views illustrating a state of the workpiece during or after each step of the method MT.
Figure 14B:
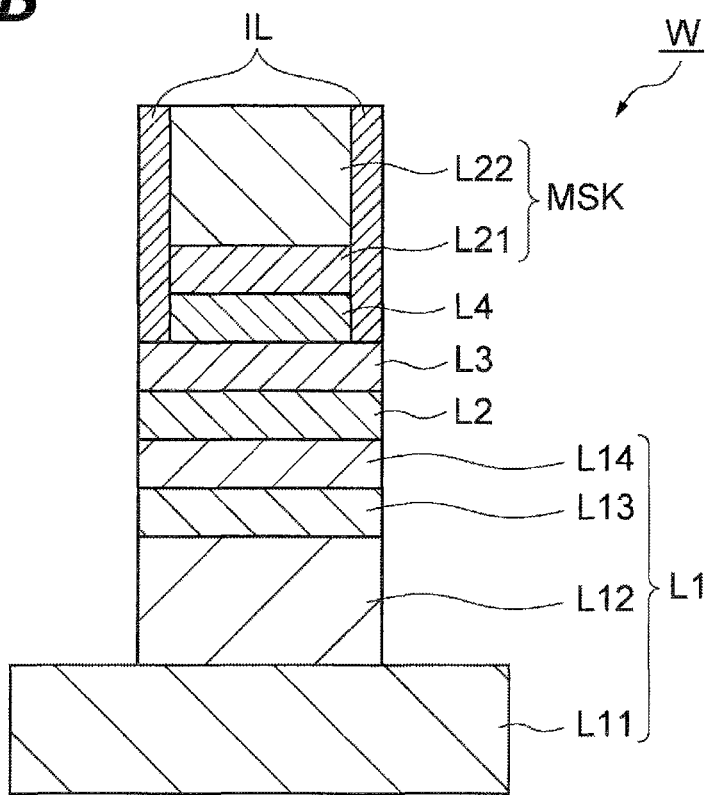

In a subsequent process ST7, the lower magnetic layer L2 is etched as illustrated in FIG. 13A, and in a subsequent process ST8, a deposit DP3 generated by the etching in the process ST6 is removed as illustrated in FIG. 13B. Since the lower magnetic layer L2 is formed of the same material as the upper magnetic layer L4, in one exemplary embodiment, the condition of the process ST7 may be the same as the condition of the process ST2. In addition, the condition of the process ST8 may be the same as the condition of the process ST3. In addition, the process ST7 and the process ST8 may be alternately executed multiple times. That is, plasma of the rare gas (e.g., a Kr gas) and the hydrogen-containing gas is generated in both the process ST7 and the process ST8, and the modulated DC voltage is applied to the lower electrode 34 of the holding structure 18. The voltage value of the modulated DC voltage is 300 [V] or less, for example, 200 [V].

Alternatively, in another exemplary embodiment, the condition of the process ST7 may be the same as the condition of the process ST5, and the condition of the process ST8 may be the same as the condition of the process ST6. That is, plasma of the rare gas (e.g., a Kr gas) and the hydrogen-containing gas is generated in both the process ST7 and the process ST8, and a relatively high voltage value, for example, a modulated DC voltage larger than 300 [V], or a high-frequency bias power is supplied to the lower electrode 34 of the holding structure 18. In addition, in the process ST8, the holding structure 18 is set to a inclined state, and the holding unit 30 is rotated. In addition, the holding structure 18 may be set to a inclined state and the holding unit 30 may be rotated in a part of the entire period of the process ST7. In the exemplary embodiment, it is possible to etch the insulating layer L3 and the lower magnetic layer L2 collectively under the same condition.

In a subsequent process ST9, the underlying layer L1 is etched. In one exemplary embodiment, the anti-ferromagnetic layer L12 is etched from the nonmagnetic layer L14 of the underlying layer L1 to the surface (upper surface) of the lower electrode layer L11.

Figure 15:
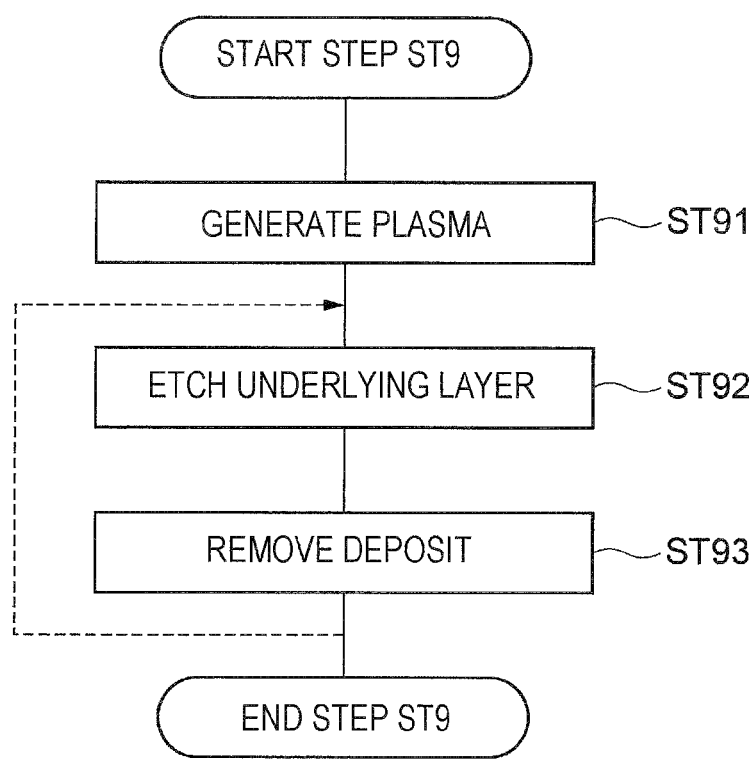
FIG. 15 is a flowchart illustrating one exemplary embodiment of a process ST9.

FIG. 15 is a flowchart illustrating one exemplary embodiment of the process ST9. As illustrated in FIG. 15, in the process ST9 of one exemplary embodiment, first, in a process ST91, plasma is generated in the processing container 12. The condition for generating the plasma in the process ST91 is the same as the condition of the process ST5. That is, in the exemplary embodiment, the anti-ferromagnetic layer L12 may be etched collectively from the insulating layer L3, the lower magnetic layer L2, and the nonmagnetic layer L14 by using the condition of the process ST5. In addition, processes ST92 and ST93 are executed while maintaining the plasma generation condition set in the process ST91.

According to the exemplary embodiment illustrated in FIG. 15, in the process ST92, as illustrated in FIG. 14A, each layer of the underlying layer L1 from the nonmagnetic layer L14 to the anti-ferromagnetic layer L12 is etched, and a deposit DP4 generated by this etching is removed in the process ST93. Thereby, the deposit attached to the side surface having a shape formed by etching on the wafer W is removed from the entire region of the side surface of the shape, and is also removed in the surface of the wafer W.

Figure 16:
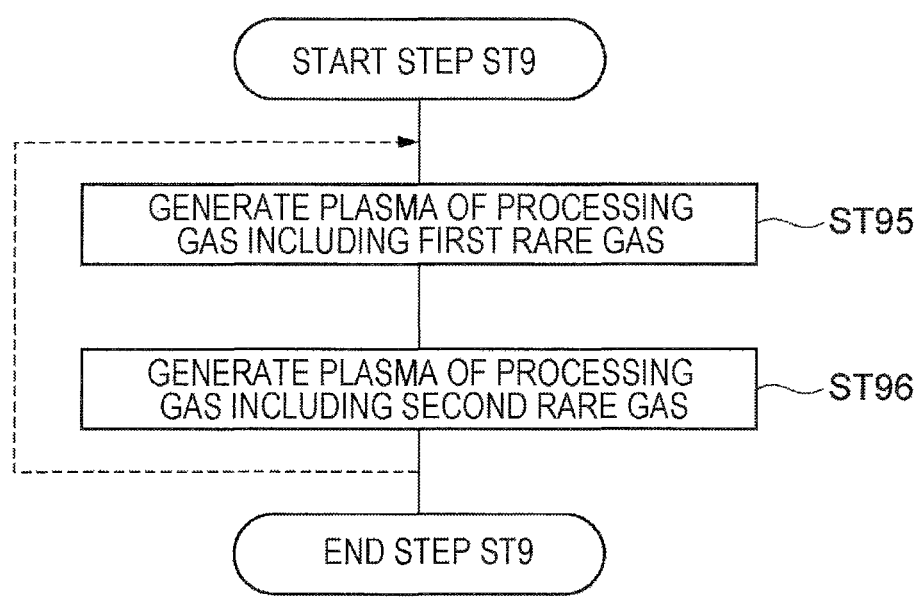
FIG. 16 is a flowchart illustrating another exemplary embodiment of the process ST9.

FIG. 16 is a view illustrating another exemplary embodiment of the process ST9. The process ST9 illustrated in FIG. 16 includes processes ST95 and ST96. In the process ST95, plasma of a processing gas containing a first rare gas having an atomic number larger than the atomic number of argon is generated. The first rare gas is, for example, a Kr gas. In the process ST96, plasma of a processing gas containing a second rare gas having an atomic number smaller than the atomic number of argon is generated. The second rare gas is, for example, a Ne gas. In addition, in the exemplary embodiment, a high-frequency bias electric power may be supplied to the holding structure 18 (the lower electrode 34) in both the processes ST95 and ST96.

[Process of Rotating Holding Structure]

Next, a process of rotating the holding structure 18 performed in the method MT will be described. By this rotation process, sufficiently uniform etching may be performed on the surface FS of the wafer W. The process of rotating the holding structure 18 is a process (etching process) in which an etching processing is performed in the method MT, and is performed at least in the processes ST2, ST5, and ST7 illustrated in FIG. 9 and in the process ST92 illustrated in FIG. 16. Each etching step of the processes ST2, ST5, ST7, and ST92 is a step of etching the wafer W with plasma generated in the processing container 12. The rotation process is a process of performing inclining and rotation of the holding structure 18 holding the wafer W during the execution of the etching.

The rotation process performed in each etching process may consist of one inclined rotation state or a plurality of inclined rotation states $RT(\varphi, t)$ in order to implement sufficiently uniform etching with respect to the surface FS of the wafer W. That is, each rotation process sequentially implements a plurality of inclined rotation states $RT(\varphi, t)$ with respect to the holding structure 18 holding the wafer W.

"$\varphi$" is the value [Deg.] of the inclination angle AN, and "t" is the process time [min]. The inclined rotation state $RT(\varphi, t)$ is a state where the second axis AX2, which is the central axis of the wafer W, is inclined with respect to the axis PX of the processing container 12 in the same plane (in the YZ plane) as the second axis AX2 and the wafer W is rotated over a predetermined process time t about the second axis AX2. Specifically, the inclined rotation state RT(φ, t) is a state where the holding structure 18 is inclined by the inclination angle AN (the value φ [Deg.]) of the second axis AX2 about the first axis AX1, and the holding unit 30 of the holding structure 18 is rotated by t [min] about the second axis AX2 in a state where the inclination of the holding structure 18 (the value φ [Deg.] of the inclination angle AN of the second axis AX2) is maintained. In this manner, the inclined rotation state RT(φ, t) is specified by φ [Deg.] and t [min]. In addition, a case where one rotation process consists of a plurality of inclined rotation states RT(φ$_i$, t$_i$) ("i" is an identifier for identifying each inclined rotation state and is a natural number within the range of 1 to N (N is a natural number)), the plurality of inclined rotation states RT(φ$_i$, t$_i$) are successively and sequentially implemented in a predetermined order. That is, in one rotation process, a plurality of inclined rotation states RT(φ$_1$, t$_1$), . . . , RT(φ$_N$, t) are successively and sequentially implemented. In the plurality of inclined rotation states RT(φ, t), combinations of the value φ of the inclination angle AN and the process time t differ from each other.

Figure 19A:
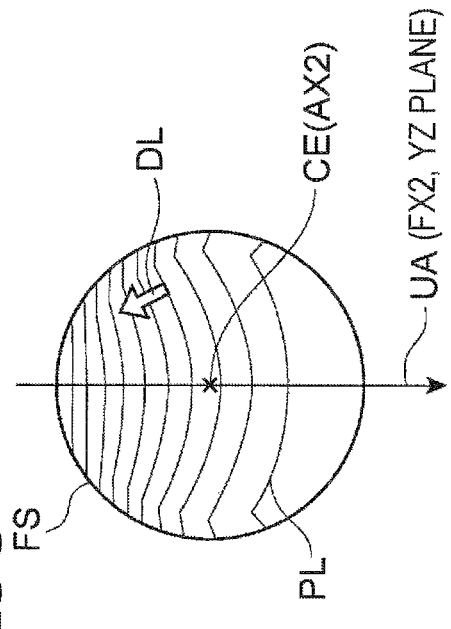
FIGS. 19A to 19D are views illustrating an example of the distribution of the etching rate on the surface of a wafer according to one exemplary embodiment, FIG. 19A illustrating a case where the value of the inclination angle of the wafer is zero [Deg.], FIG. 19B illustrating a case where the value of the inclination angle of the wafer W is 20 [Deg.], FIG. 19C illustrating a case where the value of the inclination angle of the wafer is 45 [Deg.], and FIG. 19D illustrating a case where the value of the inclination angle of the wafer W is 60 [Deg.].
Figure 19B:
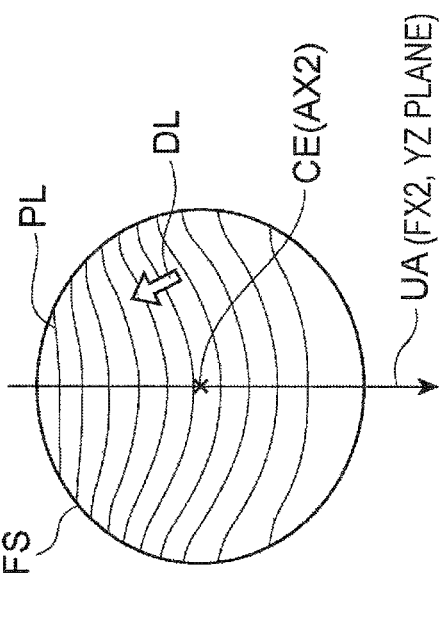
Figure 19C:
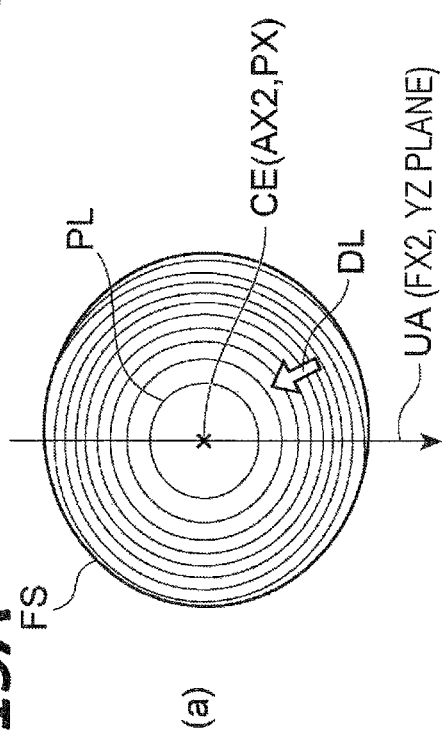
Figure 19D:
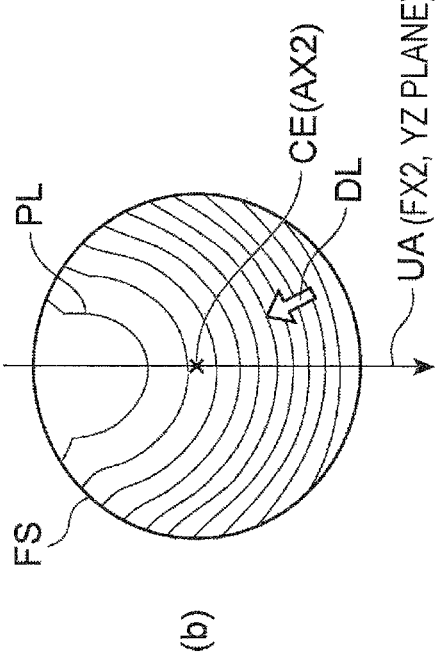

A method of specifying the content of the inclined rotation states RT(φ$_i$, t$_i$) will be described. First, as a matter necessary for explaining the method, a description of the configuration of the processing container 12, in which the rotation process is performed, will be added. In the processing container 12, in a state where the second axis AX2 is not inclined with respect to the axis PX, the etching rate [μm/min] with respect to the surface FS of the wafer W is implemented in an axis-symmetric distribution about the axis PX, and the distribution of the etching rate [μm/min] may be highest at the position of the axis PX on the surface FS. FIGS. 19A to 19D are views illustrating an example of the distribution of the etching rate (μm/min) on the surface FS of the wafer W according to one exemplary embodiment. The second axis AX2, which is the central axis of the wafer W, passes through the center CE of the surface FS illustrated in FIGS. 19A to 19D. The direction UA is a direction in which the second axis AX2 is inclined with respect to the axis PX as viewed from the surface FS, passes through the center CE of the surface FS, is in the YZ plane, and coincides with the diametric direction (radial direction) of the surface FS. A plurality of curves PL illustrated in FIGS. 19A to 19D indicate the contour lines of the etching rate [μm/min]. The etching rate [μm/min] illustrated in FIGS. 19A to 19D increases toward the direction DL. FIG. 19A illustrates the contour lines of the etching rate [μm/min] with respect to the surface FS of the wafer W in a state where the holding structure 18 is not inclined (that is, a state where the second axis AX2 overlaps the axis PX and the value φ of the inclination angle AN of the second axis AX2 is 0 [Deg.]). In this case, the axis PX of the processing container 12 overlaps the second axis AX2, which is the central axis of the wafer W, and is orthogonal to the surface FS of the wafer W. FIG. 19B illustrates the contour lines of the etching rate [μm/min] with respect to the surface FS of the wafer W in a case where the holding structure 18 is inclined and the value φ of the inclination angle AN of the second axis AX2 is 20 [Deg.]. In this case, the axis PX is moved along the direction UA in a direction opposite to the direction UA (a direction opposite to the inclined direction of the holding structure 18). FIG. 19C illustrates the contour lines of the etching rate [μm/s] with respect to the surface FS of the wafer W in a case where the holding structure 18 is inclined and the value φ of the inclination angle AN of the second axis AX2 is 45 [Deg.]. In this case, as compared with the state illustrated in FIG. 19B, the axis PX is further moved along the direction UA in the direction opposite to the direction UA (the direction opposite to the inclined direction of the holding structure 18). FIG. 19D illustrates the contour lines of the etching rate [μm/s] with respect to the surface FS of the wafer W in a case where the holding structure 18 is inclined and the value φ of the inclination angle AN of the second axis AX2 is 60 [Deg.]. In this case, as compared with the state illustrated in FIG. 19C, the axis PX is further moved along the direction UA in the direction opposite to the direction UA (the direction opposite to the inclined direction of the holding structure 18). In addition, the value φ of the inclination angle AN of the second axis AX2 with respect to the axis PX is not limited to 60 [Deg.] as long as it is within the range of 0 to 360 [Deg.].

In addition, FIG. 20 illustrates the contour lines of the etching rate [μm/min] illustrated in FIGS. 19A to 19D as viewed along the vertical reference plane FA2 (the YZ plane). FIG. 20 is a view illustrating the distribution of the etching rate [μm/min] illustrated in FIGS. 19A to 19D along the radial direction (direction UA) of the surface FS of the wafer W. In FIG. 20, the horizontal axis represents the radial direction (direction UA) of the surface FS, and the vertical axis represents the etching rate [μm/min]. A curve PM1 illustrated in FIG. 20 corresponds to the etching rate [μm/min] illustrated in FIG. 19A, a curve PM2 illustrated in FIG. 20 corresponds to the etching rate [μm/min] illustrated in FIG. 19B, a curve PM3 illustrated in FIG. 20 corresponds to the etching rate [μm/min] illustrated in FIG. 19C, and a curve PM4 illustrated in FIG. 20 corresponds to the etching rate [μm/min] illustrated in FIG. 19D.

As illustrated in FIG. 19A, it can be seen that the etching rate [μm/min] with respect to the surface FS of the wafer W in a case where the holding structure 18 is not inclined is substantially axis-symmetrical with respect to the second axis AX2 (in this case, the axis PX) with respect to the surface FS of the wafer W. Specifically, it can be seen that the etching rate (μm/min) with respect to the surface FS is distributed so as to be the highest at the position of the second axis AX2 (the axis PX), which is the central axis of the wafer W, and to be substantially axis-symmetrically reduced toward the edge of the wafer W. Then, when the wafer W is inclined as illustrated in FIGS. 19B to 19D from the state where the wafer W is not inclined as illustrated in FIG. 19A, the contour lines of the etching rate [μm/min] in the vicinity of the maximum value are displaced from the position of the second axis AX2, which is the central axis of the wafer W, onto the surface FS in the direction (Y direction) opposite to the inclined direction, and the axis-symmetry of the etching rate [μm/min] (further, the interval between the contour lines) is eliminated.

From the configuration of the processing container 12 described above, the inventors have found that the distribution of the etching rate [μm/min] in the processing container 12 is substantially axis-symmetrical about the axis PX and that the etching rate [μm/min] decreases with an increasing distance from the ceiling side of the processing container 12 (the side of the plasma source 16). Then, as a result of intensive research, the inventors have found that a suitable predicted distribution of the etching rate (μm/min) for the wafer W (or any other wafer) in the processing container 12 (or any other processing container) may be obtained by the following etching rate function PER1(x, y, z; φ; CON) for each value φ [Deg.] of the inclination angle AN of the second axis AX2 and for each etching condition CON.

$$PER1(x,y,z;\varphi;CON) = (\text{Numerical Value of } \zeta/\{(x-\alpha)^2 + (y-\beta)^2 + (z-\gamma)^2\}^{\xi/2}) \quad \text{Equation 1}$$

As described above, the predicted distribution of the etching rate [μm/min] with respect to the surface FS of the wafer W corresponds to the numerical value of $\zeta/\{(x-\alpha)^2+(y-\beta)^2+(z-\gamma)^2\}^{\xi/2}$, which is a function of the coordinates (x, y, z) of a point in the processing container 12 and includes parameters α, β, γ, ζ, and ξ. PERI(x, y, z; φ; CON) is an example of a plurality of predicted distributions of the etching rate [μm/min] with respect to the surface FS of the wafer W, and the following etching rate function PER2(φ, r, θ; CON) is the same. The plurality of predicted distributions, for example, PER1(x, y, z; φ; CON) are obtained in advance before the implementation of the method MT. The etching rate [μm/min] obtained by each of the plurality of inclined rotation states RT($\Phi_i$, $t_i$) implemented in the rotation process of each step corresponds to one of the plurality of predicted distributions (e.g., PER1(x, y, z; φ; CON)) obtained in advance.

Each of x, y, and z of PER1(x, y, z; φ; CON) is the coordinate value of the X axis (the value in the unit of [mm]), the coordinate value of the Y axis (the value in the unit of [mm]), or the coordinate value of the Z axis (the value in the unit of [mm]), and each of α, β, and γ of PER1(x, y, z; φ; CON) is the coordinate value of the X axis, (the value in the unit of [mm]), the coordinate value of the Y axis (the value in the unit of [mm]), or the coordinate value of the Z axis (the value in the unit of [mm]). ζ of PER1(x, y, z; φ; CON) is a dimensional value [μm/min], and is the value of the etching rate [μm/min]. Since the point (α, β, γ) is regarded as a predetermined reference point on the plasma source side of the plasma processing apparatus 10, ζ is regarded as the etching rate [μm/min] at the point (x, y, z) in the processing container 12 in a case where a length from the reference point to the point (x, y, z) is a unit length. "ξ" is a value having no unit (dimension). The etching condition CON may be specified by various parameters that implement an etching process, such as, for example, the type of a gas used for etching, and the material of a film on the surface of the wafer W to be etched. The etching condition CON may differ in each of the processes ST2, ST5, ST7, and ST92. The predicted distribution such as, for example, PER1(x, y, z; φ; CON) differs depending on the combination of the value φ [Deg.] of the inclination angle AN and the etching condition CON performed in the processing container 12.

$\zeta/\{(x-\alpha^2)+(y-\beta)^2+(z-\gamma)^2\}^{\xi/2}$ of Equation 1 has a predetermined dimension since, for example, x or has a unit and dimension, but PER1(x, y, z; φ; CON) has only the numerical value (the numerical value excluding the dimension) of $\zeta/\{(x-\alpha)^2+(y-\beta)^2+(z-\gamma)^2\}^{\xi/2}$.

Figure 17:
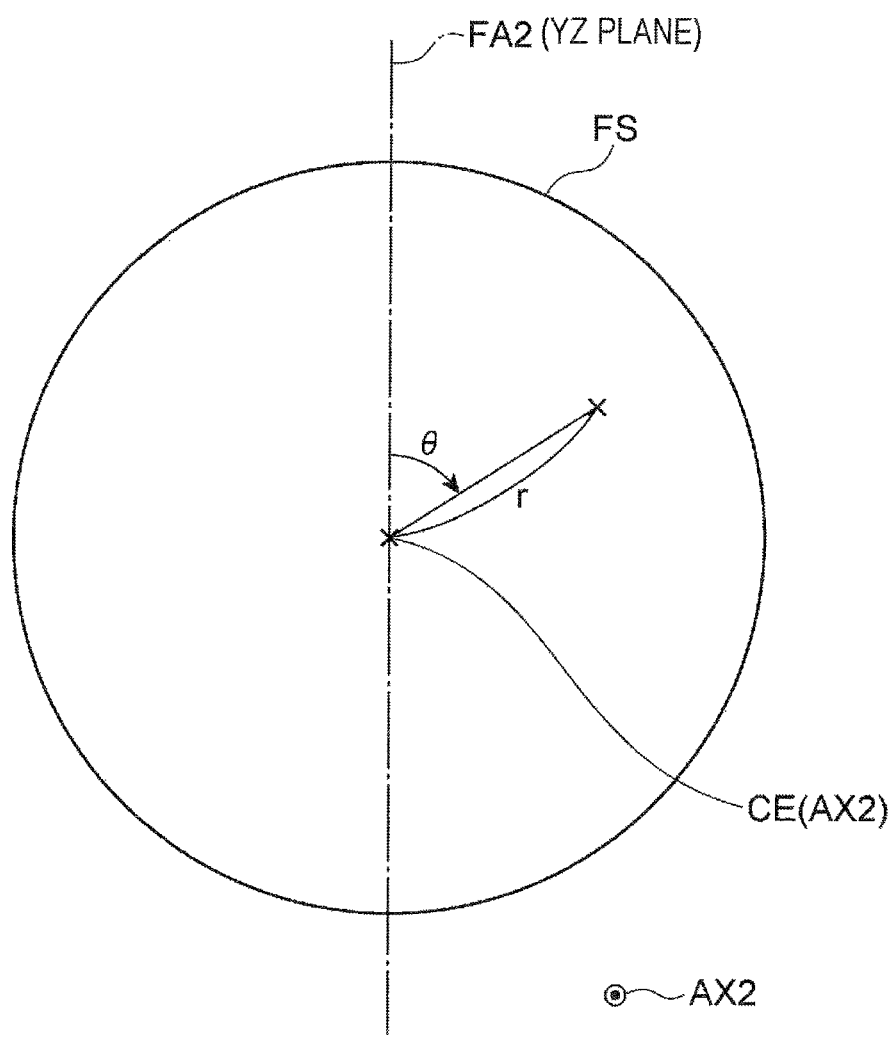
FIG. 17 is a view illustrating a wafer surface according to one exemplary embodiment with polar coordinates.

In addition, PER1(x, y, z; φ; CON) may be converted into the etching rate function PER2(φ, r, θ; CON) with respect to the surface FS(φ, r, θ) of the wafer W on the holding structure 18, the second axis AX2 of which is inclined by the value φ [Deg.] of the inclination angle AN, and thereafter, the PER2(φ, r, θ; CON) may be used. This conversion is performed by coordinate transformation from the coordinates (x, y, z) to the coordinates (φ, r, θ) with respect to PER1(x, y, z; φ; CON). As illustrated in FIG. 17, a set of r and θ is the polar coordinates of the surface FS with the center CE of the surface FS as the origin, and represents a point on the surface FS. FIG. 17 is a view illustrating the surface FS of the wafer W according to one exemplary embodiment with the polar coordinates. "r" is the radius [mm] from the center CE of the surface FS, and "θ" is the angle of deviation [Deg.] from the vertical reference plane FA2. The center CE of the surface FS is on the second axis AX2 and is in the vertical reference plane FA2. In addition, PER2(φ, r, θ; CON) contains the same parameters α, β, γ, ζ, and ξ as those of PER1(x, y, z; φ; CON).

Referring to FIGS. 19A to 19D, due to the inclination of the holding structure 18, the distribution of the etching rate [μm/min] with respect to the surface FS is not axis-symmetrical about the central axis (the second axis AX2) of the wafer W, but is non-uniform, but this non-uniformity may be satisfactorily solved by making the etching rate [μm/min] uniform by the integration effect of the rotation of the surface FS in the direction of the angle of deviation θ of the surface FS. Therefore, by assuming the rotation of the wafer W about the second axis AX2 and integrating PER2(φ, r, θ; CON) with θ (the integration range is 0 to 360 [Deg.]), a function FA(φ, r; CON) is obtained. FA(φ, r; CON) is the result of integrating PER2(φ, r, θ; CON) with θ (the integration range is 0 to 360 [Deg.]).

Figure 18:
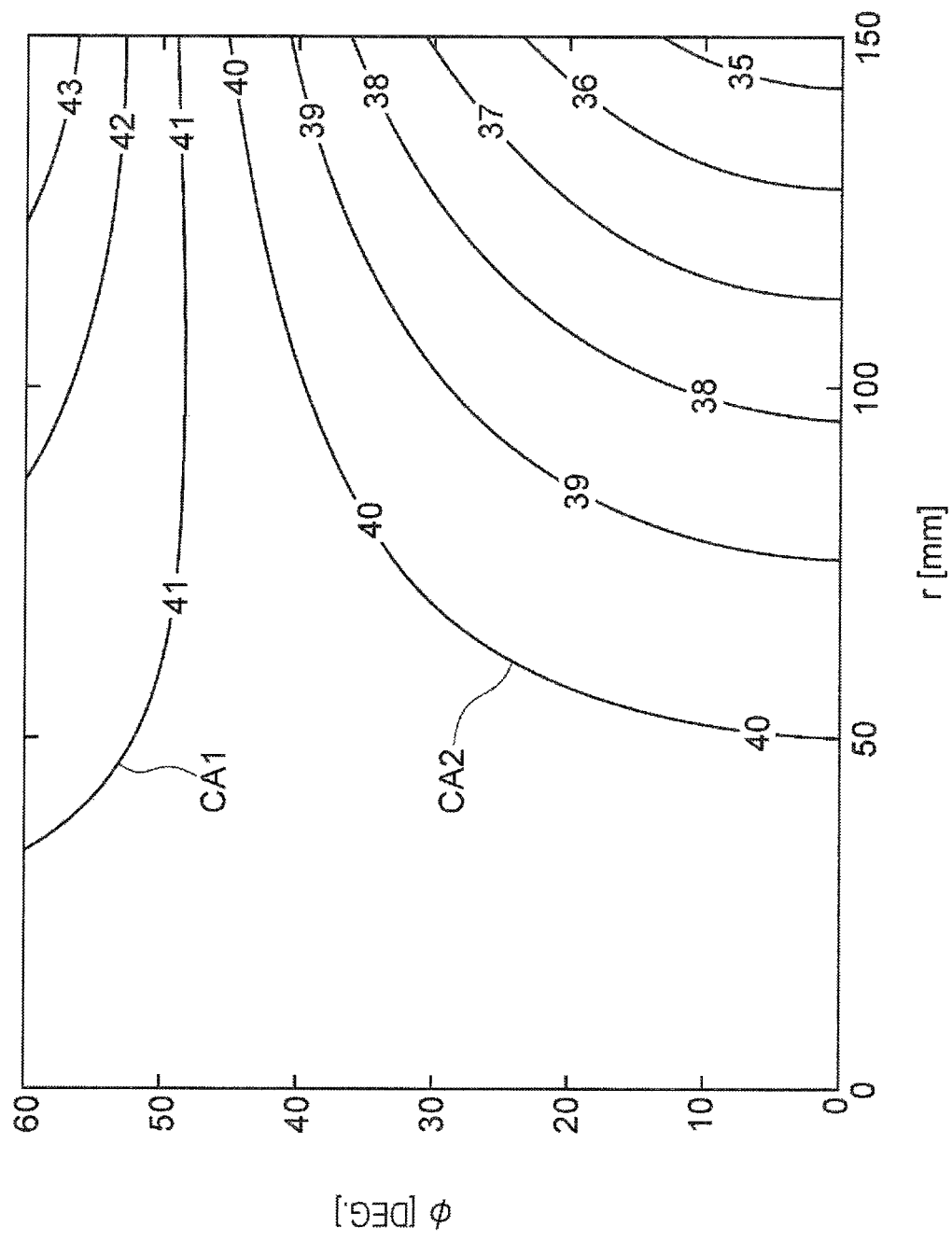
FIG. 18 is a view illustrating an example of the content of an etching rate function according to one exemplary embodiment.

An example of FA(φ, r; CON) is illustrated in FIG. 18. FIG. 18 is a view illustrating an example of an etching rate function according to one exemplary embodiment. In FIG. 18, the horizontal axis represents the radius r [mm], and the vertical axis represents the value φ [Deg.] of the inclination angle AN of the second axis AX2. A plurality of curves illustrated in FIG. 18 are the contour lines of the etching rate [μm/min]. For example, a curve CA1 is the contour line with the etching rate of 41 [μm/min], and a curve CA2 is the contour line with the etching rate of 40 [μm/min]. In FA(φ, r; CON) illustrated in FIG. 18, the etching rate [μm/min] is substantially uniform in the r direction when "φ" is about 45 [Deg.].

Then, a case where the rotation process, which is executed in each process of the etching process such as, for example, the process ST2, consists of the plurality of inclined rotation states RT($\varphi_i$, $t_i$) is assumed, the sum KA(r; CON) of m($\varphi_i$)× FA($\varphi_i$, r; CON) with respect to a plurality of $\varphi_i$ is calculated, and one or a plurality of $\varphi_i$ and m($\varphi_i$) are specified such that fluctuation of KA(r; CON) in the r direction is as small as possible (or is less than or equal to a predetermined reference). "m($\varphi_i$)" corresponds to the value of the process time $t_i$ [min] of the inclined rotation state RT($\varphi_i$, $t_i$) (that is, the time taken to perform the rotation process around the second axis AX2 in a state where the second axis AX2 is inclined by $\varphi_i$), and satisfies the proportional relationship of m($\varphi_1$): m($\varphi_2$): . . . : m($\varphi_N$)=$t_1$: $t_2$: . . . : $t_N$. As described above, the process time $t_i$ [min] of each of the plurality of inclined rotation states RT($\varphi_i$, $t_i$) is indicated by a weighting value m($\varphi_i$) given to the predicted distributions (e.g., PER2(φ, r, θ; CON)).

As described above, "$\varphi_i$" and "m($\varphi_i$)" used in the rotation process in each process of the etching process are specified. A plurality of predicted distributions (e.g., FA(φi, r; CON)) of the same etching condition CON as the etching condition CON of etching performed in each process of the etching process, among the plurality of predicted distributions (e.g., FA(φi, r; CON)) obtained in advance before execution of the method MT, and a weighting value of each of the plurality of predicted distributions are specified, the plurality of inclined rotation states RT($\varphi_i$, $t_i$) implemented by the rotation process in each process such as, for example, the process ST2 are specified by using the value $\varphi_i$ [Deg.] of the inclination angle AN of each of the plurality of specified predicted distributions (e.g., FA($\varphi_i$, r; CON)), and in each process of the etching process, the plurality of specified inclined rotation states RT($\varphi_i$, $t_i$) are implemented.

Here, the synthesis of two inclined rotation states RT($\varphi_i$, $t_i$) will now be examined with reference to the results of measurement MK1 to measurement MK3 that actually measure the etching rate [μm/min]. The same etching condition CON is used in any of the measurement MK1 to the measurement MK3, and the etching condition CON includes a factor such as etching using Ar plasma. Then, in the measurement MK1, only the inclined rotation state RT ($\varphi$=30 [Deg.], t=1 [min]) was implemented. In the measurement MK2, only the inclined rotation state RT ($\varphi$=70 [Deg.], t=1 [min]) was implemented. In the measurement MK3, after the inclined rotation state RT ($\varphi_1$=0 degrees, $t_1$=0.5 [min]) is implemented, the inclined rotation state RT (q=70 [Deg.], $t_1$=0.5 [min]) was implemented.

In each of the measurement MK1 to the measurement MK3, an average value [µm/min] of the etching rate, a standard deviation [µm/min], a fluctuation value [µm/min], and a fluctuation value/average value×100 [%] of the etching rate were calculated. The average value [µm/min], the standard deviation [µm/min], the fluctuation value [µm/min], and the fluctuation value/average value×100 [%] are statistical values obtained by measured values of the etching rate [µm/min] at respective points on the surface FS. In addition, the fluctuation value is a value obtained by subtracting the minimum value of the measured values from the maximum value of the measured values of the etching rate [µm/min].

<Statistical Value of Measurement MK1> average value=26.4 [µm/min], standard deviation=0.96 [µm/min], fluctuation value=3.82 [µm/min], and fluctuation value/average value× 100=14.5 [%].

<Statistical Value of Measurement MK2> average value=20.7 [µm/min], standard deviation=0.36 [µm/min], fluctuation value=1.60 [µm/min], and fluctuation value/average value× 100=7.76 [%].

<Statistical Value of Measurement MK3> average value=24.5 [µm/min], standard deviation=0.44 [µm/min], fluctuation value=1.82 [µm/min], and fluctuation value/average value× 100=7.45 [%].

In addition, the sum of ½ of each statistical value of the measurement MK1 and ½ of each statistical value of the measurement MK2 is illustrated below.

<(½ of the Statistical Value of the Measurement MK1)+(½ of the Statistical Value of the Measurement MK2)> average value=23.6 [µm/min], standard deviation=0.31 [µm/min], fluctuation value=1.23 [µm/min], and fluctuation value/average value× 100=5.21 [%].

Among the statistical values in the above four cases, in particular, when comparing "the statistical value of the measurement MK2" with "(½ of the statistical value of the measurement MK1)+(½ of the statistical value of the measurement MK2)", they are roughly the same (the difference between them may be caused, for example, by angular decomposition). That is, it is considered that the etching rate [µm/min], which is obtained when the two inclined rotation states are actually implemented in succession, is substantially the same as one obtained by adding two etching rates (µm/min) obtained by independently realizing respective inclined rotation states. Therefore, it can be seen that the sum K(r; CON) of the plurality of m($\varphi_i$)×FA($\varphi_i$, r; CON) may suitably correspond to an actually measured value of the etching rate [µm/min] obtained by actually realizing the plurality of inclined rotation states RT($\varphi_i$, $t_i$) in succession.

In addition, as a specific method of specifying $\varphi_i$ and m($\varphi_i$), for example, the following method may be considered by way of example, but it is not limited thereto. That is, one or a plurality of $\varphi_i$, the fluctuation Δr of which with respect to "r" of FA($\varphi$, r; CON) is equal to or less than a predetermined reference, is specified in advance. The fluctuation Δr may be, for example, a value obtained by subtracting the minimum value from the maximum value of FA($\varphi$, r; CON) in the r direction (radial direction). In addition, for one or a plurality of $\varphi_i$ specified in this way, m($\varphi_1$)×FA($\varphi_1$, r; CON)++m($\varphi_N$)×FA($\varphi_N$, r; CON)=KA(r; CON) is calculated, and "m" is specified such that the fluctuation in the r direction is the smallest in the calculated KA(r; CON). $\varphi_i$ and m($\varphi_i$) may be specified using such a method, but is not limited to this.

As described above, the content of the inclined rotation states RT($\varphi_i$, $t_i$) is specified. In addition, a method of specifying the parameters α, β, γ, ζ, and ξ used in the above Equation 1 will be described. The parameters α, β, γ, ζ, and ξ are specified by the actually measured values of the etching rate (µm/min) by etching performed under the same etching condition CON as the etching condition CON in each process of the etching process. Combinations of the parameters α, β, γ, ζ, and ξ differ for each etching condition CON and for each value $\varphi$ [Deg.] of the inclination angle AN of the second axis AX2. The values of the parameters α, β, γ, ζ, and ξ are determined for each value $\varphi$ [Deg.] of the inclination angle AN used when obtaining the actually measured values that specify the parameters. In other words, in PER1(x, y, z; $\varphi$; CON)=(Numerical Value of $\zeta/\{(x-\alpha)^2+(y-\beta)^2+(z-\gamma)^2\}^{\xi/2}$), the etching condition CON and the value $\varphi$ [Deg.] of the inclination angle AN of the second axis AX2 are reflected in the respective values of α, β, γ, ζ, and ξ.

First, before the method MT is carried out, based on a predetermined etching condition using the plasma processing apparatus 10 (e.g., the etching condition in the process ST2), in each of the states where the value $\varphi$ [Deg.] of the inclination angle AN of the second axis AX2 is at least three types (e.g., 0, 30, and 60 [Deg.]), the etching rate [µm/min] in the processing container 12 with respect to the wafer W is measured, and based on the measured result, a plurality of (M) actually measured values ER($x_k$, $y_k$, $z_k$; $\varphi$) [µm/min] (k is a natural number within the range of 1 to M) and is the reference character for identifying the respective actually measured values of the etching rate, and M is the number of actually measured values) in the processing container 12 of the plasma processing apparatus 10 are obtained for each value $\varphi$ of the inclination angle AN of the second axis AX2 used for the actual measurement (e.g., 0, 30 and 60 [Deg.]). In addition, the number of values $\varphi$ [Deg.] may be larger than the above three types within the range of 0 to 360 [Deg.]. $x_k$, $y_k$, and $z_k$ are the coordinates of points in the processing container 12 in which the etching rate [µm/min] is actually measured as described above, and $x_k$, $y_k$, and $z_k$ are respectively the coordinate value of the X axis (the value in the unit of [mm]), the coordinate value of the Y axis (the value in the unit of [mm]), and the coordinate value of the Z axis (the value in the unit of [mm]). The number M of the actually measured values ER($x_k$, $y_k$, $z_k$; $\varphi$) [µm/min] of the etching rate [µm/min] is the value for each value $\varphi$ [Deg.] of the inclination angle AN of the second axis AX2 used in the actual measurement, and is the number required to sufficiently and precisely specify the parameters α, β, γ, ζ, and ξ.

Then, by substituting the numerical value of ER($x_k$, $y_k$, $z_k$; $\varphi$) [µm/min] into the above Equation 1 with regard to each k (k=1 to M) for each value $\varphi$ [Deg.] of the inclination angle AN of the second axis AX2, M equations concerning the parameters α, β, γ, ζ, and ξ of (the numerical value of ER($x_k$, $y_k$, $z_k$; φ))=(the numerical value of $\zeta/\{(x_k-\alpha)^2+(y_k-\beta)^2+(z_k-\gamma)^2\}^{\xi/2}$) are obtained. The parameters α, β, γ, ζ, and ξ are specified from these M equations for each value φ [Deg.] of the inclination angle AN of the second axis AX2 used for the actual measurement. In addition, the above-described specification of the parameters α, β, γ, ζ, and ξ may be performed by directly using PER2(φ, r, θ; CON), instead of PER1(x, y, z; CON).

The value of PER2(φ, r, θ; CON) corresponding to PER1(x, y, z; CON) specified as described above and the actually measured etching rate (in the measurement ME1 to the measurement ME6) [μm/min] were compared. Specifically, the average error [μm/min] between the etching rate [μm/min] measured in each of the measurement ME1 to the measurement ME6 and the respective values (the values are regarded as having a dimension [μm/min]) of PER2(φ, r, θ; CON) specified respectively as described above based on the φ [Deg.] of the inclination angle AN of the second axis AX2 and the etching condition CON used in each of the measurement ME1 to the measurement ME6 was calculated. The measured value of the etching rate [μm/min] obtained by using the same etching condition CON and the same value φ [Deg.] of the inclination angle AN of the second axis AX2 and the value of PER2(φ, r, θ; CON) were used as a calculation target (comparison target) of the average error [μm/min]. The etching condition CON and the value φ [degree] of the inclination angle AN of the second axis AX2 used in each of the measurement ME1 to the measurement ME6 are reflected in the parameters α, β, γ, ζ, and ξ of each PER2(φ, r, θ; CON), which is the comparison target of the etching rate [μm/min] obtained in each of the measurement ME1 to the measurement ME6. Hereinafter, the average error [μm/min] of the etching rate obtained in each of the measurement ME1 to the measurement ME6 is illustrated below. In addition, the average error [μm/min] is obtained by dividing the sum of all of the absolute values of the difference $\Delta_j$ between the actually measured value of the etching rate [μm/min] and the value of PER2(φ, r, θ; CON) at all measurement points $P_j$ (j is the reference character for identifying the measurement point) at which the etching rate [μm/min] is actually measured on the surface FS by the number of measurement points $P_j$.

<Measurement ME1>

In the etching condition CON, a factor in which an object of etching using Ar plasma is an Ox blanket wafer was included. The value φ of the inclination angle AN of the second axis AX2 was 0 [Deg.]. With regard to the parameters α, β, γ, ζ, and ξ, α was 0 [mm], β was 0 [mm], γ was 400.8 [mm], ζ was 8.98×10$^9$ [μm/min], and ξ was 3.21. In addition, the average error [μm/min] of the etching rate was 0.279 [μm/min].

<Measurement ME2>

In the etching condition CON, a factor in which an object of etching using Ar plasma is an Ox blanket wafer was included. The value φ of the inclination angle AN of the second axis AX2 was 30 degrees. With regard to the parameters α, β, γ, ζ, and ξ, α was 0 [mm], β was −106.8 [mm], γ was 416.1 [mm], ζ was 8.98×10$^9$ [μm/min], and ξ was 3.21. In addition, the average error [μm/min] of the etching rate was 0.480 [μm/min].

<Measurement ME3>

In the etching condition CON, a factor in which an object of etching using Ar plasma is an Ox blanket wafer was included. The value φ of the inclination angle AN of the second axis AX2 was φ was 60 [Deg.]. With regard to the parameters α, β, γ, and a was 0 [mm], β was −197.2 [mm], γ was 405.5 [mm], ζ was 8.98×10$^9$ [μm/min], and ξ was 3.21. In addition, the average error [μm/min] of the etching rate was 0.725 [μm/min].

<Measurement ME4>

In the etching condition CON, a factor in which an object of etching using O$_2$ plasma is a KrF blanket wafer was included. The value φ of the inclination angle AN of the second axis AX2 was 0 [Deg.]. With regard to the parameters α, β, γ, ζ, and ξ, α was 0 [mm], β was 0 [mm], γ was 379.4 [mm], ζ was 2.46×10$^8$ [μm/min], and ξ was 2.31. In addition, the average error [μm/min] of the etching rate was 2.48 [μm/min].

<Measurement ME5>

In the etching condition CON, a factor in which an object of etching using O$_2$ plasma is a KrF blanket wafer was included. The value φ of the inclination angle AN of the second axis AX2 was 30 [Deg.]. With regard to the parameters α, β, γ, ζ, and ξ, α was 0 [mm], β was −71.0 [mm], γ was 383.5 [mm], ζ was 2.46×10$^8$ [μm/min], and ξ was 2.31. In addition, the average error [μm/min] of the etching rate was 1.70 [μm/min].

<Measurement ME6>

In the etching condition CON, a factor in which an object of etching using O$_2$ plasma is a KrF blanket wafer was included. The value φ of the inclination angle AN of the second axis AX2 was φ was 60 [Deg.]. With regard to the parameters α, β, γ, and a was 0 mm, β was −133.0 mm, γ was 390.6 mm, ζ was 2.46×10$^8$ [μm/min], and ξ was 2.31. In addition, the average error [μm/min] of the etching rate was 3.61 [μm/min].

In view of the above, in the method MT, since the plurality of inclined rotation states RT($\varphi_i$, $t_i$) having different values φ [Deg.] of inclination angle AN of the wafer W and the process time t [min] may be combined during the execution of etching, it is possible to sufficiently improve the uniformity of the etching rate of the wafer W by adjusting the combination.

In addition, in the processing container 12, since the distribution of the etching rate is axis-symmetric distribution about the axis PX of the processing container 12 in a state where the second axis AX2, which is the central axis of the wafer W, is not inclined, by suitably inclining the second axis AX2 with respect to the axis PX, the center of the distribution of the etching rate is moved on the surface FS of the wafer W to eliminate axial symmetry, and the distribution of the etching rate, including the interval of the contour lines of the distribution, may be adjusted with high accuracy. Then, by realizing the distribution of the etching rate, from which the axial symmetry has been eliminated in this manner, the height difference of the distribution of the etching rate are sufficiently eliminated by the rotation of the wafer W about the second axis AX2, and the uniformity of the etching rate is improved.

In addition, since the plurality of inclined rotation states RT($\varphi_i$, $t_i$) implemented by the etching process such as, for example, the process ST2 is specified by using the predicted distribution of the etching rate acquired in advance, the uniformity of the actually implemented distribution of the etching rate may be effectively implemented.

In addition, since the predicted distribution of the etching rate is precisely expressed by using the coordinate values for each point in the processing container 12, when the predicted distribution is used, the value $\varphi_i$ [Deg.] of the inclination angle AN and the process time $t_i$ for each inclined rotation state RT($\varphi_i$, $t_i$) may be specified with good precision.

In addition, since the respective values of the parameters α, β, γ, ζ, and ξ included in the predicted distribution of the etching rate are determined for each value depending on the value φ [Deg.] of the inclination angle AN, when the predicted distribution is specified, the value φ [Deg.] of the inclination angle AN that implements the etching rate corresponding to the predicted distribution is easily specified.

In addition to the value φ [Deg.] of the inclination angle AN, since the predicted distribution depending on the position of the intersection point XO of the second axis AX2, which is the central axis of the wafer W, and the axis PX of the processing container 12 may be used, it is possible to specify the value φ$_i$ [degree] of the inclination angle AN and the process time t$_i$ suitable for use in the etching process such as, for example, the process ST2 in more detail.

Although the principle of the present disclosure has been illustrated and described in the preferred exemplary embodiments, it will be appreciated by those skilled in the art that the present disclosure may be modified in arrangement and details without departing from such a principle. The present disclosure is not limited to the specific configuration disclosed in the exemplary embodiments. Accordingly, all modifications and changes caused within the scope of the claims and the spirit thereof are claimed.

Modification 1

For example, when considering a case of moving the inclination shaft unit 50 (the first axis AX1) along the axis PX (in other words, a case of moving the position of the intersection point XO of the second axis AX2 (the central axis of the wafer W) and the axis PX (the reference axis of the processing container 12) along the axis PX), the predicted distribution of the etching rate [μm/min] such as, for example, PER1(x, y, z; φ; CON) differs according to the combination of the value φ [Deg.] of the inclination angle AN, the etching condition CON of the etching performed in the processing container 12, and the position on the axis PX of the intersection point XO of the first axis AX1 and the axis PX (specifically, for example, the distance L between the intersection point XO and the horizontal reference plane FA1). In this case, the respective values of the parameters α, β, γ, ζ, and ξ are determined for each state in a case of obtaining actually measured values used for specifying the parameter, specifically a value (e.g., for each distance L) depending on the value φ of the inclination angle AN [Deg.] and the position on the axis PX of the intersection point XO.

The effect achieved by the configuration of Modification 1 will be described. An example of FA(φ, r; CON) in a case of Modification 1 is illustrated in FIGS. 21A, 21B, 21C and 21D. FIGS. 21A to 21D are views illustrating an example of the etching rate function FA(φ, r; CON) according to Modification 1 of the exemplary embodiment. In FIGS. 21A to 21D, the horizontal axis represents the radius r [mm] (r is the radius from the center CE of the surface FS of the wafer W), and the vertical axis represents the value φ [Deg.] of the inclination angle AN of the second axis AX2. A plurality of curves illustrated in FIGS. 21A to 21D correspond to the contour lines (FA(φ, r; CON)) of the etching rate [μm/min].

Figure 21A:
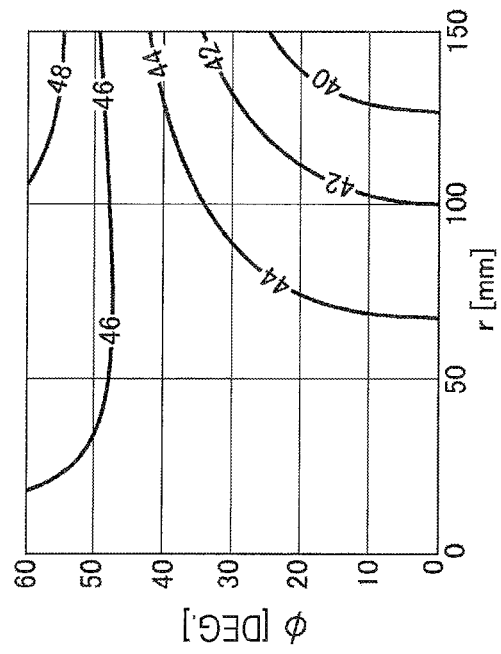
Figure 21B:
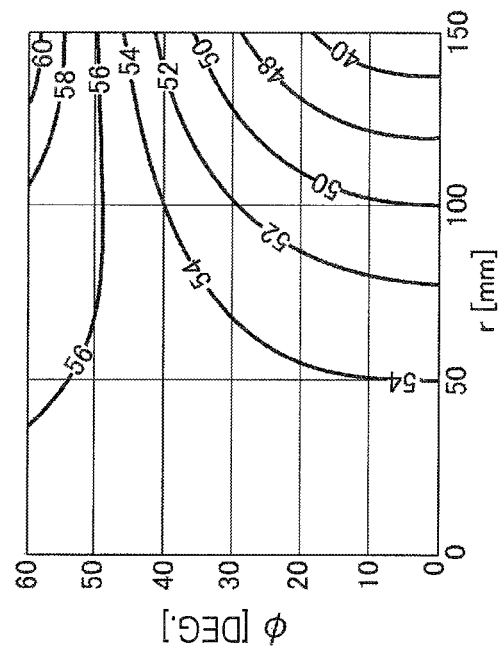
Figure 21C:
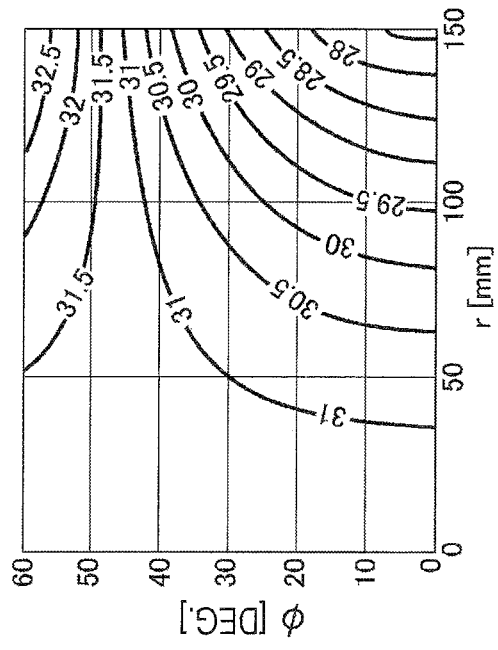
Figure 21D:
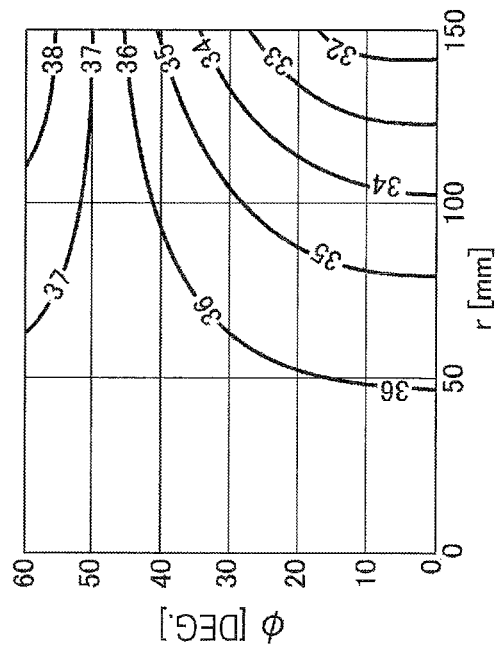

FIG. 21A illustrates the contour line of the etching rate [μm/min] obtained by the configuration of Modification 1 in a case where, in a state where the second axis AX2 coincides with the axis PX (the value φ of the inclination angle AN=0 [degree]), the distance from the upper surface 32a of the electrostatic chuck 32 to the surface of the dielectric plate 194 is −50 [mm] from a predetermined reference position (hereinafter the distance (the distance from the upper surface 32a of the electrostatic chuck 32 to the surface of the dielectric plate 194) in a case where the result illustrated in FIG. 18 is obtained). FIG. 21B illustrates the contour line of the etching rate [μm/min] obtained by the configuration of Modification 1 in a case where, in a state where the second axis AX2 coincides with the axis PX, the distance from the upper surface 32a of the electrostatic chuck 32 to the surface of the dielectric plate 194 is −20 [mm] from the reference position. FIG. 21C illustrates the contour line of the etching rate [μm/min] obtained by the configuration of Modification 1 in a case where, in a state where the second axis AX2 coincides with the axis PX, the distance from the upper surface 32a of the electrostatic chuck 32 to the surface of the dielectric plate 194 is +20 [mm] from the reference position. FIG. 21D illustrates the contour line of the etching rate [μm/min] obtained by the configuration of Modification 1 in a case where, in a state where the second axis AX2 coincides with the axis PX, the distance from the upper surface 32a of the electrostatic chuck 32 to the surface of the dielectric plate 194 is +50 [mm] from the reference position.

As illustrated in FIGS. 21A to 21D, based on the configuration of Modification 1, in a case where the first axis AX1 (the central axis of the inclination shaft unit 50) is moved (up and down) along the axis PX (the reference axis of the processing container 12), the contour line of the etching rate [μm/min] is substantially the same as the contour line illustrated in FIG. 18, but the value of the contour line is changed. That is, in a state where the second axis AX2 coincides with the axis PX, the shorter the distance from the upper surface 32a of the electrostatic chuck 32 to the surface of the dielectric plate 194 (the closer the electrostatic chuck 32 is to the dielectric plate 194), the higher the etching rate [μm/min]. As described above, by using the configuration of Modification 1, the etching rate [μm/min] may be increased without changing the shape of the contour line of the etching rate [μm/min].

Modification 2

The holding structure 18 may have a configuration in which the electrostatic chuck 32, the lower electrode 34, and the rotary shaft unit 36 are movable along the second axis AX2. In this configuration, when considering a case of moving the upper surface 32a (the surface holding the wafer W) of the electrostatic chuck 32 along the second axis AX2 (the central axis of the wafer W) (in other words, a case of moving the position of the intersection point XP of the upper surface 32a of the electrostatic chuck 32 and the second axis AX2 along the second axis AX2 while maintaining the orientation of the upper surface 32a), the predicted distribution of the etching rate such as PER1(x, y, z; φ; CON) differs according to the combination of the value φ [Deg.] of the inclination angle AN, the etching condition CON of etching performed in the processing container 12, and the position on the second axis AX2 of the intersection point XP of the upper surface 32a of the electrostatic chuck 32 and the second axis AX2. In this case, the respective values of the parameters α, β, γ, ζ, and ξ are determined for a state in a case of obtaining actually measured values used for specifying the parameters, specifically for a value depending on the value φ [Deg.] of the inclination angle AN and the position on the second axis AX2 of the intersection point XP of the upper surface 32a of the electrostatic chuck 32 and the second axis AX2. In addition, a configuration in which the configuration of Modification 1 and the configuration of Modification 2 are used at the same time is also possible.

Figure 22A:
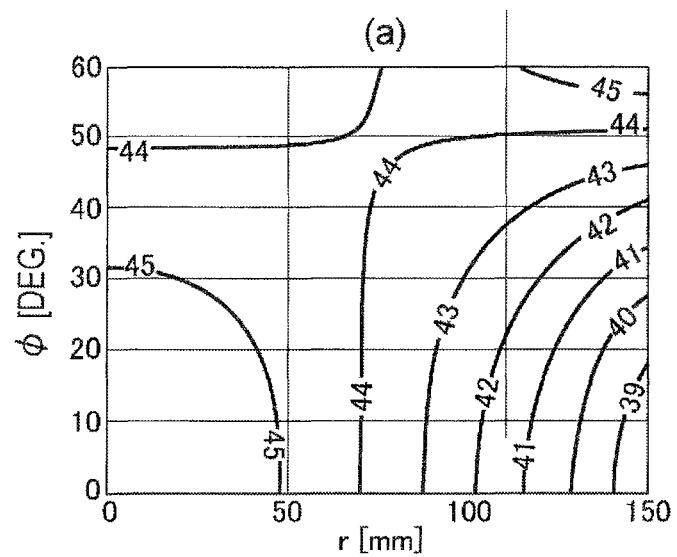
FIGS. 22A and 22B are views illustrating an example of the content of an etching rate function according to another modification of the exemplary embodiment.
Figure 22B:
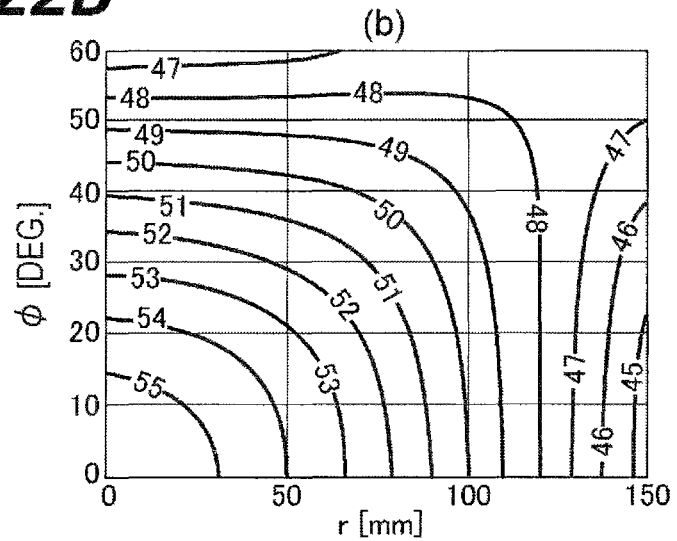

The effect achieved by the configuration of Modification 2 will be described. An example of FA(φ, r; CON) in a case of Modification 2 is illustrated in FIGS. 22A and 22B. FIGS. 22A and 22B are views illustrating an example of the etching rate function FA(φ, r; CON) according to Modification 2 of the exemplary embodiment. In FIGS. 22A and 22B, the horizontal axis represents the radius r [mm] (r is the radius from the center CE of the surface FS of the wafer W), and the vertical axis represents the value φ [Deg.] of the inclination angle AN of the second axis AX2. A plurality of curves illustrated in each of FIGS. 22A and 22B are the contour lines of the etching rate [μm/min].

FIG. 22A illustrates the contour line of the etching rate [μm/min] obtained by the configuration of Modification 2 in a case where, in a state where the second axis AX2 coincides with the axis PX, the distance from the upper surface 32a of the electrostatic chuck 32 to the surface of the dielectric plate 194 is +20 [mm] from the reference position. FIG. 22B illustrates the contour line of the etching rate [μm/min] obtained by the configuration of Modification 2 in a case where, in a state where the second axis AX2 coincides with the axis PX, the distance from the upper surface 32a of the electrostatic chuck 32 to the surface of the dielectric plate 194 is +50 mm from the reference position.

As illustrated in FIGS. 22A and 22B, based on the configuration of Modification 2, in a case where the position of the intersection point XP of the upper surface 32a of the electrostatic chuck 32 and the second axis AX2 is moved (up and down) along the second axis AX2 while maintaining the orientation of the upper surface 32a, the contour lines of the etching rate [μm/min] are different in shape and value from those illustrated in FIG. 18. The reason why the contour lines of such an etching rate [μm/min] are obtained is because the distance from the first axis AX1 (the central axis of the inclination shaft unit 50) to the electrostatic chuck 32 (the distance to the wafer W) is increased based on the configuration of Modification 2 and, when the value φ [Deg.] of the inclination angle AN is increased, the electrostatic chuck 32 becomes closer to the inner wall surface of the processing container 12, so that the wafer W on the electrostatic chuck 32 is affected by the density of plasma on the inner wall side.

In addition, when the radius r [mm] is about 70 [mm] at the etching rate [μm/min] illustrated in FIG. 22A, or when the radius r [mm] is about 120 [mm] at the etching rate [μm/min] illustrated in FIG. 22B, the change of the etching rate [μm/min] is relatively small even if the value φ [Deg.] of the inclination angle AN is changed. The etching rate [μm/min] at such a value of the radius r [mm] (specifically, as described above, it is about 70 mm in the case illustrated in FIG. 22A, and is 120 mm in the case illustrated in FIG. 22B) may be used as a reference value of the etching rate [μm/min] in a case where a plurality of inclined rotation states $RT(\varphi_i, t_i)$ are sequentially used.

Description of Symbols

| | |
|---|---|
| 10: plasma processing apparatus, | 12: processing container |
| 12a: intermediate portion, | 12b: connection portion |
| 12e: exhaust port, | 14: gas supply system |
| 140: high-frequency antenna, | 142A: inner antenna element |
| 142B: outer antenna element, | 144: holding member |
| 14a: first gas supply unit, | 14b: second gas supply unit |
| 14e, 14f: gas discharge hole, | 150A, 150B: high-frequency power supply |
| 16: plasma source, | 160: shield member |
| 162A: inner shield wall, | 162B: outer shield wall |

Description of Symbols (continued)

| | |
|---|---|
| 164A: inner shield plate, | 164B: outer shield plate |
| 18: holding structure, | 194: dielectric plate |
| 20: exhaust system, | 20a: automatic pressure controller |
| 20b: turbo-molecular pump, | 20c: dry pump |
| 20d, 20e: valve, | 22: bias power supply unit |
| 22a: first power supply, | 22b: second power supply |
| 24a: driving device, | 26a: flow regulating member |
| 26a: upper portion, | 26b: lower portion |
| 30: holding unit, | 32: electrostatic chuck |
| 32a: upper surface, | 34: lower electrode |
| 34a, 35a: first portion, | 34b, 35b: second portion |
| 34f: coolant flow path, | 35: insulating member |
| 36: rotary shaft, | 36a: columnar portion |
| 36b: first tubular portion, | 36c: second tubular portion |
| 36d: third tubular portion, | 37: first member |
| 38: second member, | 39a, 39b, 39c: sealing member |
| 40: container unit, | 42: upper container portion |
| 44: outer container portion, | 50: inclination shaft unit |
| 52: magnetic fluid seal unit, | 52a: inner ring unit |
| 52b: outer ring unit, | 52c: magnetic fluid |
| 53, 55: bearing, | 54: rotary connector |
| 60, 64: wiring, | 62: power supply |
| 66, 72, 74: piping, | 68: heat transfer gas source |
| 70: rotary joint, | 76: chiller unit |
| 78: rotation motor, | 80: pulley |
| 82: conduction belt, | AN: inclination angle |
| AX1: first axis, | AX2: second axis |
| CA1, CA2, PL, PM1, PM2, PM3, PM4: curve | |
| CE: center, | Cnt: control unit |
| DL, UA: direction, | DP1, DP2, DP3, DP4: deposit |
| FA1: horizontal reference plane, | FA2: vertical reference plane |
| FS: surface, | IL: insulating film |
| L1: underlying layer, | L11: lower electrode layer |
| L12: anti-ferromagnetic layer, | L13: ferromagnetic layer |
| L14: nonmagnetic layer, | L2: lower magnetic layer |
| L21: first layer, | L22: second layer |
| L3: insulating layer, | L4: upper magnetic layer |
| MSK: mask, | MT: method |
| OR: origin, | PX: axis |
| S: space, | TC: 1 cycle |
| TH, TL: period, | W: wafer |
| XO: intersection point, | XP: intersection point |

What is claimed is:

1. A method of etching a workpiece using a plasma processing apparatus, the method comprising:
    etching the workpiece by plasma generated in a processing container, configured to accommodate a holder, the etching including a process of inclining and rotating the holder configured to hold the workpiece during execution of the etching,
    wherein the process sequentially implements a plurality of inclined rotation states with respect to the holder holding the workpiece,
    wherein in the inclined rotation states, the workpiece is rotated about a central axis thereof over a predetermined process time while maintaining a state in which the central axis is inclined with respect to a reference axis of the processing container which is in the same plane as the central axis,
    wherein in the plurality of inclined rotation states, a combination of a value of an inclination angle of the central axis with respect to the reference axis and the process time differs for each of the plurality of inclined rotation states,
    wherein a plurality of predicted distributions of the etching rate on the surface of the workpiece are acquired in advance before execution of the etching,
    wherein the predicted distributions differ depending on a combination of the value of the inclination angle and a condition of the etching performed in the processing container, wherein the etching rate, obtained by each of the plurality of inclined rotation states, corresponds to one of the plurality of predicted distributions, wherein the process time of each of the plurality of inclined rotation states is indicated by a weighting value given to the predicted distributions, and wherein, among the plurality of predicted distributions, a plurality of predicted distributions having the same condition as the condition of the etching and a weighting value of each of the plurality of predicted distributions are specified before the etching, the plurality of inclined rotation states are specified using the value of the inclination angle of each of the plurality of specified predicted distributions and the weighting value, and the plurality of specified inclined rotation states are implemented in the etching.

2. The method of claim 1, wherein, in the processing container, in a state in which the central axis is not inclined with respect to the reference axis, an etching rate on a surface of the workpiece is implemented in an axis-symmetric distribution about the reference axis, and the distribution of the etching rate is highest at a position of the reference axis on the surface.

3. The method of claim 1, wherein each predicted distribution corresponds to a numerical value obtained by integrating $\zeta/\{(x-\alpha)^2+(y-\beta)^2+(z-\gamma)^2\}^{\xi/2}$, which is a function of coordinates (x, y, z) of a point in the processing container and includes parameters $\alpha$, $\beta$, $\gamma$, $\zeta$, and $\xi$, about the central axis, wherein x, y, and z indicate the point in the processing container with respective coordinates of an X-axis, a Y-axis, and a Z-axis of an XYZ orthogonal coordinate system set to the processing container, $\alpha$, $\beta$, and $\gamma$ indicate a predetermined reference point on a plasma source side of the plasma processing apparatus with respective coordinates of the X-axis, the Y-axis, and the Z-axis, $\zeta$ is an etching rate at the point (x, y, z) in the processing container when a length from the reference point to the point (x, y, z) is a unit length, and the parameters $\alpha$, $\beta$, $\gamma$, $\xi$ and are specified by actually measured values of the etching rate by etching performed under the same condition as the condition of the etching in the process.

4. The method of claim 3, wherein respective values of the parameters $\alpha$, $\beta$, $\gamma$, $\zeta$, and $\xi$ are determined according to the value of the inclination angle.

5. The method of claim 4, wherein, in the processing container, a position of an intersection point of the central axis and the reference axis is movable along the reference axis, wherein the predicted distributions differ depending on a combination of the value of the inclination angle and the condition of the etching performed in the processing container, and the position of the intersection point, and wherein the respective values of the parameters $\alpha$, $\beta$, $\gamma$, $\zeta$, and $\xi$ are determined according to the value of the inclination angle and the position of the intersection point.

6. The method of claim 4, wherein, in the processing container, a position of an intersection point of the central axis and an upper surface of an electrostatic chuck, which is included in the holder and holds the workpiece, is movable along the central axis while maintaining an orientation of the upper surface, wherein the predicted distributions differ depending on a combination of the value of the inclination angle the condition of the etching performed in the processing container, and the position of the intersection point, and wherein the respective values of the parameters $\alpha$, $\beta$, $\gamma$, $\zeta$, and $\xi$ are determined according to the value of the inclination angle and the position of the intersection point.

\* \* \* \* \*